(12) United States Patent
Peter et al.

(10) Patent No.: US 9,948,294 B2
(45) Date of Patent: Apr. 17, 2018

(54) COMMUNICATING ACROSS GALVANIC ISOLATION, FOR EXAMPLE, IN A POWER CONVERTER

(71) Applicant: Power Integrations Switzerland GmbH, Biel-Bienne (CH)

(72) Inventors: Matthias Peter, Orpund (CH); Jan Thalheim, Biel-Bienne (CH)

(73) Assignee: Power Integrations Switzerland GmbH, Biel-Bienne (CH)

( * ) Notice: Subject to any disclaimer, the term of this patent is extended or adjusted under 35 U.S.C. 154(b) by 0 days.

(21) Appl. No.: 15/179,871

(22) Filed: Jun. 10, 2016

(65) Prior Publication Data

US 2017/0012622 A1 Jan. 12, 2017

(30) Foreign Application Priority Data

Jul. 8, 2015 (EP) .................................... 15175924

(51) Int. Cl.
*H03B 1/00* (2006.01)
*H03K 3/00* (2006.01)
(Continued)

(52) U.S. Cl.
CPC ............ *H03K 17/691* (2013.01); *H02M 3/07* (2013.01); *H03H 7/06* (2013.01); *H03K 5/05* (2013.01);
(Continued)

(58) Field of Classification Search
CPC ...... H03K 17/51; H03K 17/56; H03K 17/567; H03K 17/60; H03K 17/689; H03K 17/691;
(Continued)

(56) References Cited

U.S. PATENT DOCUMENTS

2009/0091413 A1  4/2009 Kato et al.
2009/0245432 A1* 10/2009 Matsumoto ....... H04L 25/03171
                                                    375/341
(Continued)

FOREIGN PATENT DOCUMENTS

WO   WO 2004/100473 A2   11/2004

OTHER PUBLICATIONS

EiceDRIVER™, Final Data Sheet: 1ED020112-F2—Single IGBT Driver IC (Rev. 2.0, Aug. 1, 2011), © 2011 Infineon Technologies AG, Munich, 28 pages.
(Continued)

*Primary Examiner* — Lincoln Donovan
*Assistant Examiner* — Diana J Cheng
(74) *Attorney, Agent, or Firm* — Christensen O'Connor Johnson Kindness PLLC

(57) ABSTRACT

A signal transmission system for communicating across galvanic isolation. The signal transmission system includes first circuitry referenced to a first potential, the first circuitry comprising signal transmission circuitry, second circuitry referenced to a second potential and galvanically isolated from the first circuitry, the second circuitry comprising signal reception circuitry, and a magnetic coupling between the first circuitry to the second circuitry across the galvanic isolation, the magnetic coupling comprising a transmitter-side inductor and a receiver-side inductor. The signal transmission circuitry can include a source coupled to output, to the transmitter-side inductor of the magnetic coupling, a first state representation that represents a first logic state with multiple transitions, the first state representation including at least a first upward transition, a first downward transition, a second upward transition, and a second downward transition.

39 Claims, 14 Drawing Sheets

(51) Int. Cl.
  *H03K 17/691* (2006.01)
  *H04L 25/02* (2006.01)
  *H02M 3/07* (2006.01)
  *H03H 7/06* (2006.01)
  *H03K 5/05* (2006.01)
  *H03K 17/567* (2006.01)
(52) U.S. Cl.
  CPC ....... *H03K 17/567* (2013.01); *H04L 25/0266* (2013.01)
(58) Field of Classification Search
  CPC .. H03K 5/01; H03K 5/04; H03K 5/05; H02M 3/02; H02M 3/04; H02M 3/06; H02M 3/07; H02M 3/073; H02M 2003/071; H02M 2003/072; H02M 2003/075; H02M 2003/076; H02M 2003/077; H02M 2003/078; H03H 7/01; H03H 7/06; H03H 7/065; H03H 7/07; H04L 25/00; H04L 25/02; H04L 25/0264; H04L 25/0266; H04L 25/0268; H04L 25/027

USPC .................................................. 327/108–112
  See application file for complete search history.

(56) References Cited

U.S. PATENT DOCUMENTS

2010/0329364 A1   12/2010   Giombanco et al.
  2013/0049815 A1   2/2013   Koenigsmann et al.
  2013/0055052 A1   2/2013   Kaeriyama
  2014/0103736 A1   4/2014   Akahane

OTHER PUBLICATIONS

European Patent Application No. 15175924.8—European Search Report, dated May 11, 2016, 8 pages.
  European Patent Application No. 15175924.8—European Office Action, dated May 23, 2016, 10 pages.

* cited by examiner

COMMUNICATING ACROSS GALVANIC ISOLATION, FOR EXAMPLE, IN A POWER CONVERTER

REFERENCE TO RELATED APPLICATIONS

This application claims priority to European Patent (EP) Application No. 15175924.8, filed on Jul. 8, 2015. EP Application No. 15175924.8 is hereby incorporated by reference.

BACKGROUND

1. Technical Field

This disclosure relates generally to communication between a transmitter and receiver across galvanic isolation using an inductive coupling, for example, in the context of a power converter in which the primary side is galvanically isolated from the secondary side.

2. Discussion of the Related Art

Electrical devices in many contexts include a communication system to send information between a transmitter and a receiver that are galvanically isolated and are hence referenced to different ground potentials. Examples include power converters, medical equipment, marine equipment, and the like.

One such communication system utilizes magnetically coupled wires to send information between a transmitter and a receiver. Otherwise also known as inductive coupling, a varying current flowing through a transmitting conductor induces a varying voltage across the ends of a receiving conductor. The coupling between the conductors can be strengthened in various ways. For example, conductive wires may be formed into coils with or without a magnetic core. Examples of inductive couplings include a transformer and a coupled inductor.

Despite the magnetically coupling of such conductors, the conductors can remain electrically isolated from each other so that a voltage difference can be applied without significant electrical conduction therebetween. However, so long as the magnetic coupling between the conductors is sufficiently strong, information can be conveyed across this electrical isolation.

SUMMARY

Systems and techniques for transmitting signals across galvanic isolation using an inductive coupling are described. The described systems and techniques can be used in a variety of contexts where galvanic isolation is desirable, including, e.g., in power converters.

In one aspect, a signal transmission system for communicating across galvanic isolation includes first circuitry referenced to a first potential, the first circuitry comprising signal transmission circuitry; second circuitry referenced to a second potential and galvanically isolated from the first circuitry, the second circuitry comprising signal reception circuitry; and a magnetic coupling between the first circuitry to the second circuitry across the galvanic isolation, the magnetic coupling comprising a transmitter-side inductor and a receiver-side inductor. The signal transmission circuitry includes a source coupled to output, to the transmitter-side inductor of the magnetic coupling, a first state representation that represents a first logic state with multiple transitions, the first state representation including at least a first upward transition, a first downward transition, a second upward transition, and a second downward transition, and a second state representation that represents a second logic state with multiple transitions.

This and other aspects can include one or more of the following features. The transmitter-side inductor can have a first terminal at the first potential. The first upward transition can raise a second terminal the transmitter-side inductor above the first potential. The first downward transition can lower the second terminal of the transmitter-side inductor below the first potential. The second upward transition can raise the second terminal of the transmitter-side inductor above the first potential. The second downward transition can lower the second terminal of the transmitter-side inductor below the first potential. The energy stored in the transmitter-side inductor in a first direction during a time above the first potential defined by the first upward transition and the first downward transition can substantially equal the energy discharged from the transmitter-side inductor in a second direction opposite the first direction during a time below the first potential defined by the first downward transition and the second upward transition. The time above the first potential defined by the first upward transition and the first downward transition can substantially equal the time below the first potential defined by the first downward transition and the second upward transition. The time above the first potential defined by the first upward transition and the first downward transition can be between 1 and 10 nS, for example, between 3 and 7 nS. The time below the first potential defined by the first downward transition and the second upward transition can be between 1 and 10 nS, for example, between 3 and 7 nS.

The second state representation can include the first upward transition, the first downward transition, the second upward transition, and the second downward transition. The second state representation can include a third upward transition, a third downward transition, a fourth upward transition, and a fourth downward transition. The transitions in the first state representation and the second state representation can be timed to so that the source delivers—to the transmitter-side inductor—a current capable of inducing a measurable potential in the receiver-side inductor during an entirety of the state representation.

The signal reception circuitry can include a filter coupled to the receiver-side winding of the small-inductance magnetic coupling. The filter can pass the transitions in state representations received from the transmitter-side winding but filter lower frequency components. The timing of at least some of the transitions in the first state representation and in the second state representation can be selected such that the transmitter-side inductor can demagnetize between the transitions.

The source of the signal transmission circuitry can include a pulse generator. The first state representation can include multiple pulses to represent the first logic state. The second state representation can include multiple pulses to represent the second logic state. The signal reception circuitry can include pulse density determination circuitry to determine a density of the pulses within a received signal. The pulse density determination circuitry can include a charge pump and a capacitor, wherein the charge pump is coupled to charge or discharge the capacitor in accordance with the density of pulses.

The signal reception circuitry can include a comparator to compare a voltage on the capacitor with a threshold to decode the state representation. The signal reception circuitry can include a second comparator to compare the voltage on the capacitor with a second threshold to decode the state representation, wherein the first threshold differs from second threshold. The pulse density determination circuitry can include a current sink coupled to discharge or charge a capacitor with a time constant longer than the duration of the pulses but shorter than the duration of the state representations.

The transmission circuitry can include a repetition code transmitter to repeatedly transmit a message to the receiver side. The signal reception circuitry can include a repetition code receiver. The repetition code transmitter can repeat a single state representation. The signal reception circuitry can include synchronization circuitry to determine a timing of the repetition of the message and adjust an oscillator in the second circuitry based on the determined timing. The second circuitry can include a calibrated current source coupled to discharge a capacitor. The calibrated current source can be calibrated based at least in part on the timing of the repetition of the message. The different state representations can have different durations.

In outputting the first state representation, the signal transmission circuitry can be coupled to output an information portion that includes the multiple transitions of the first state representation and an initial delay portion having a duration longer than a maximum duration of an information portion of the second state representation. The information portion of the second state representation can include the multiple transitions of the second state representation. In outputting the second state representation, the signal transmission circuitry can be coupled to output an information portion that includes the multiple transitions of the second state representation and an initial delay portion having a duration longer than a maximum duration of an information portion of the first state representation. The information portion of the first state representation can include the multiple transitions of the first state representation.

The transmission circuitry can include a repetition code transmitter to repeatedly transmit state representations to the receiver side. The repetition code transmitter can be prohibited from commencing repetition of a preceding state representation during the initial delay portion. The first circuitry can include signal reception circuitry coupled to the transmitter-side winding. The second circuitry can include signal transmission circuitry coupled to the receiver-side winding. The signal transmission circuitry can be prohibited from outputting information during a backchannel portion for transmission of information from the second circuitry to the first circuitry.

The signal transmission circuitry can be coupled to transmit a change state command to signal a transition from a first state representation to a second state representation. The change state command can be a superposition of at least part of a first state representation and the second state representation. The first circuitry can be formed on a first semiconductor die and the second circuitry can be formed on a second semiconductor die. The first semiconductor die and the second semiconductor die can be packaged in a single semiconductor package. The magnetic coupling can include a winding formed of an upper layer metallization of an integrated circuit, a portion of a lead frame. The portion of the lead frame can be at one of the first potential and the second potential.

The magnetic coupling can have an inductance of 50 nH or less, e.g., 20 nH or less. The pulse source can be configured to generate pulses having a duration of 10 nS or less, e.g., 5 nS or less.

A power converter can include the signal transmission system of any of the preceding aspects. In such a power converter, the pulse source can be coupled to output a first state representation indicating that a power switch of the power converter is to transition from an on-state to an off-state and a second state representation indicating that a power switch of the power converter is to transition from the off-state to the on-state. The power converter can include an insulated gate bipolar transistor power switch.

A controller for a power converter that comprises a power switch can include primary-side circuitry referenced to a first potential, the first circuitry comprising signal transmission circuitry; secondary-side circuitry referenced to a second potential and galvanically isolated from the first circuitry, the second circuitry comprising signal reception circuitry and a driver to be coupled to the power switch; and a magnetic coupling between the primary-side circuitry and the secondary-side circuitry across the galvanic isolation therebetween. The magnetic coupling can include a transmitter-side inductor and a receiver-side inductor. The signal transmission circuitry can be configured to repeatedly transmit a first signal indicating that the power switch is to be transitioned from an ON state to an OFF state during a time when the power switch is to be in the OFF state, and a second signal indicating that a power switch is to be transitioned from the OFF state to the ON state during a time when the power switch is to be in the ON state.

In such a controller, the first signal can include a first information portion and a first delay that does not include information. The second signal can include a second information portion and a second delay that does not include information. The first delay can have a duration greater than or equal to a duration of the second information portion. The second delay can have a duration greater than or equal to a duration of the first information portion. The first information portion can include multiple upward transitions and multiple downward transitions. The second information portion can include multiple upward transitions and multiple downward transitions.

In such a controller, the signal transmission circuitry can include a source coupled to output, to the transmitter-side inductor of the magnetic coupling. A first state representation can represent a first logic state with multiple transitions. The first state representation can include at least a first upward transition, a first downward transition, a second upward transition, and a second downward transition. A second state representation can represent a second logic state with multiple transitions. The transitions in the first state representation and the second state representation can be timed to so that the source delivers—to the transmitter-side inductor—a current capable of inducing a measurable potential in the receiver-side inductor during an entirety of the state representation. The timing of at least some of the transitions in the first information portion and in the second information portion can be selected such that the transmitter-side inductor can demagnetize between the transitions. The first information portion can include a collection of M pulses. The second information portion can include a collection of N pulses. M need not be equal to N.

The signal transmission circuitry can also configured to transmit a third signal indicating that a power switch is to transition from a) the present of either the ON state and the OFF state to b) the other of the ON state and the OFF state. The third signal can be a superposition of at least portions of the first information portion and the second information portion. The first signal can indicate that the power switch is to be transitioned from the ON state to the OFF state using a first plurality of transitions. The second signal can indicate that the power switch is to be transitioned from the OFF state to the ON state using a second plurality of transitions. The signal transmission circuitry can also be configured to transmit a third signal indicating that a power switch is to transition from a) the present of either the ON state and the OFF state to b) the other of the ON state and the OFF state. The third signal can include transitions appearing in the first plurality of transitions and in the second plurality of transitions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
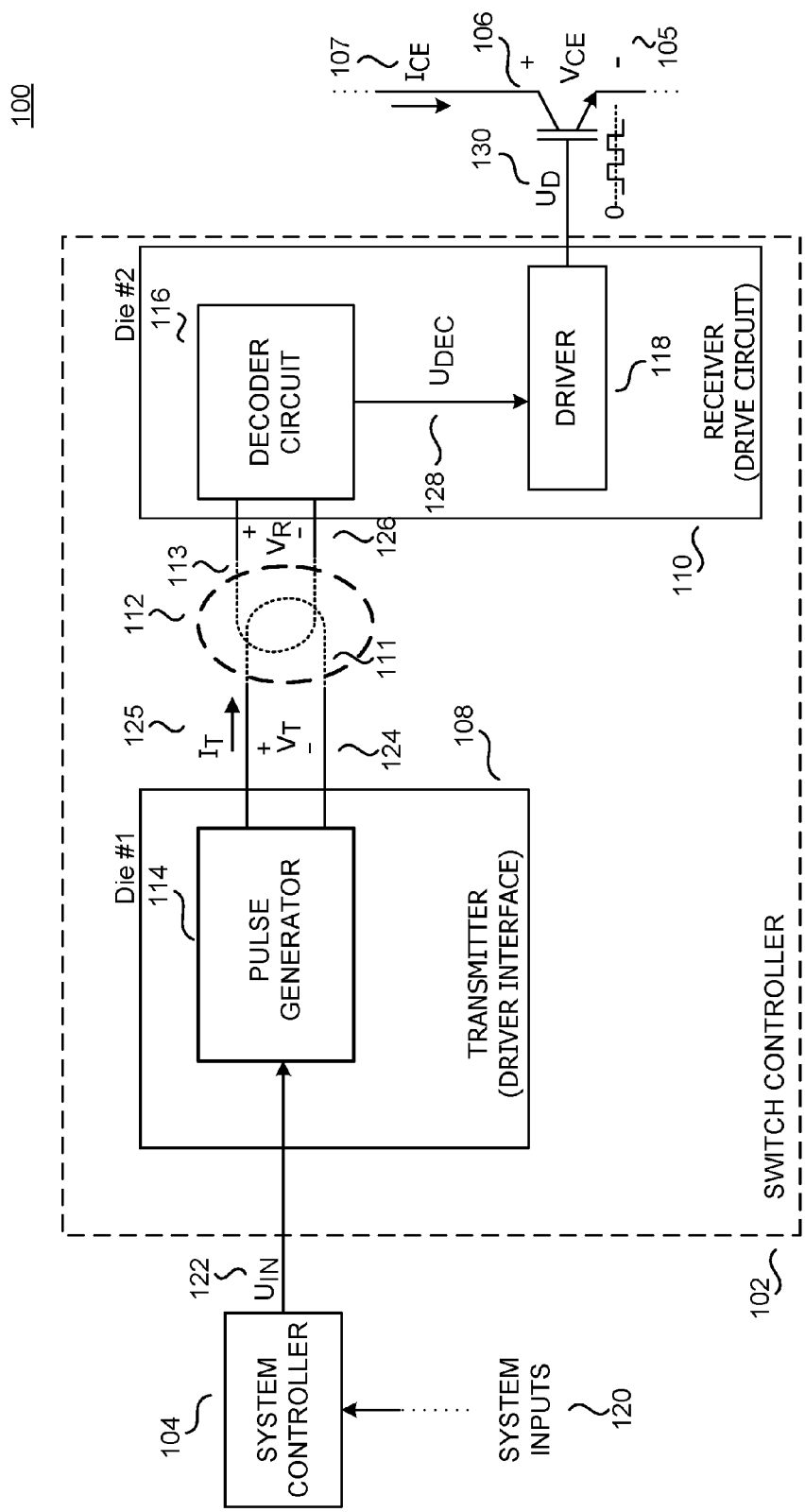
FIG. 1 illustrates one example of a switch controller which utilizes a communication link to communicate between a transmitter and a receiver, in accordance with teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, electrical devices may include a magnetic coupling for a transmitter and receiver to communicate. One example device may be a power conversion system in which a switch controller controls the switching of a power switch. In some such power conversion systems, the power switch may be an insulated-gate bipolar transistor (IGBT) controlled by an IGBT driver. In some cases, the switch controller may include a driver interface and a drive circuit that are coupled to communicate across galvanic isolation using an inductive coupling as a communication link. Examples of inductive couplings include transformers and coupled inductors. The driver interface may be on the primary side of the transformer while the drive circuit may be on the secondary side. The communication link galvanically isolates the primary side from and the secondary side. The driver interface may be coupled to receive one or more input signals that includes information relevant to driving the power switch between an ON state and OFF state. At least some of the information in the input signal is communicated to the drive circuit across the galvanic isolation via the inductive coupling in the communication link. Based at least in part on the communicated information, the drive circuit generates the drive signal to drive the switching of the power switch.

In some cases, the primary and secondary side circuitry can be implemented on separate integrated circuit (IC) dice. Those dice can either be packaged in a single integrated circuit package or packaged in separate integrated circuit packages. In some systems in which the primary and secondary side circuitry are in separate integrated circuit packages, external circuits and components are often used to facilitate communication between primary and secondary while at the same time providing the necessary galvanic isolation. The use of external circuits and components to communicate between separate ICs in separate packages may increase the overall size of the switch controller.

An integrated circuit package typically includes a lead frame. Lead frames provide mechanical support for the die or dice within the integrated circuit package. In general, a lead frame includes a die attach pad to which a semiconductor die is attached. In addition, the lead frame generally also includes leads that serve as electrical connections to the pins of the package and ultimately to external circuitry. Lead frames are generally constructed from a flat sheet of metal that is stamped, etched, punched, etc., with a pattern to define die attach pads and various leads of the lead frames.

In some power conversion systems, both the die of the driver interface and the die of the driver circuit may be packaged within a single package and communicate via a communication link. In some cases, the inductive coupling that forms the communication link may include conductive loops formed of lead frames that support the driver interfaces and driver circuits. In other instances, the inductive coupling may include the top metallization layer of each die of the driver interface and driver circuit. However, the inductive couplings that use either lead frames or top metallization layers are weak in that the magnetic coupling strength is low and communications are sensitive to noise.

In some cases of the present invention, a transmitter and receiver can communicate across galvanic isolation using an inductive coupling and a pulse generator that represent logical states using multiple upward transitions and multiple downward transitions. In idealized traditional binary logical systems, a changed logical state is generally represented by a single upward and/or downward transition that brings the binary signal to a desired level. If the logical state is to return to its previous value after a period of time has passed, a single transition in the opposite direction can return the binary signal to the initial level. For example, a single logical "high" state that is preceded and followed by logical "low" states can be represented by a signal that transitions upward from a low level to a higher (e.g., voltage or current) level and then—after a suitable period of time has passed—transitions downward to return to the low level. As another example, a single logical "low" state that is preceded and followed by logical "high" states can be represented by a signal that transitions downward to a low level and then—after a suitable period of time has passed—transitions upward to return to the high level. Even though multiple transitions and states can be assembled together to communicate multiple bits of information, the smallest unit of information, i.e., individual states, are represented using at most a single upward transition and a single downward transition.

In contrast, when a transmitter and receiver communicate using a pulse generator that represents logical states using multiple upward transitions and multiple downward transitions, the representations of the smallest units of information can include multiple levels and multiple transitions over the duration of the state. For example, in the context of a power converter, the smallest information unit can indicate that the power switch is to transition from an ON state to an OFF state. Another example is an information unit indicating that the power switch is to transition from an OFF state to an ON state. Although such units of information can be represented with a single state, the physical representation of those states includes multiple pulses having multiple transitions. By way of example, in the context of a power conversion system, the number of pulses in a single state duration may indicate whether the power switch is to be turned on or to be turned off.

As a corollary, the individual pulses defined by a single upward transition and a single downward transition (in either order) within each state representation are not sufficient to unambiguously represent that state. For example, in the representative example described in further detail below, a single pulse can be a constituent of either a first set of multiple pulses that represents a first state or a second set of multiple pulses that represents a second state. In isolation, the single pulse is insufficient to unambiguously represent the smallest unit of information in the communication system.

Using multiple pulses and multiple levels to represent a single state can be advantageous when communicating between a transmitter and receiver across galvanic isolation using an inductive coupling, especially when the strength of the inductive coupling is quite low and/or the environment is quite noisy. An example of such a context is a power conversion system in which the magnetic coupling of the conductors is weak, such as when an inductive couplings uses either lead frames or top metallization layers.

In this regard, if an ideal inductor is coupled in series with an ideal resistor and a voltage step is applied across the two, the inductor will initially drop 100% of the voltage. However, the percent of the voltage dropped by the inductor will decrease exponentially with a time constant $\tau$ that is proportional to the inductance of the inductor and inversely proportional to the resistance of the resistor. As the voltage dropped by the inductor decreases, the voltage dropped by the resistor increases. After approximately $5\tau$, more than 99% of the voltage will be dropped across the resistor.

Such an idealized model can be used to represent the real-world coupling of a voltage pulse into a transmitting inductor of an inductive coupling. In particular, real-world pulse generators have a finite output impedance that can generally be approximated as an ideal resistor. If the inductance of the transmitting inductor is very low, the time constant $\tau$ will be very short. A short time after a pulse is applied, the voltage dropped by the transmitting inductor will fall to near zero and almost all of the voltage will be dropped by the output impedance of the pulse generator. As voltage is no longer dropped by the transmitting inductor, the current through the transmitting inductor approaches a constant value. With a constant current, the transmitting inductor does not induce a varying voltage in the receiving inductor. This occurs even though the transmitter is still applying a voltage pulse and outputting current to the transmitting inductor. In effect, the receiving inductor no longer receives information from the transmitting inductor and communication is lost—notwithstanding the ongoing power consumption.

By varying voltage levels at a sufficiently high rate using multiple upward transitions and multiple downward transitions to represent a single state, the current in the transmitting inductor need not fall to a level where a varying voltage is no longer induced in the receiving inductor. Not only can the receiving inductor receive information from the transmitting inductor for a longer period of time, the power consumed by the transmission is better allocated to communicating data rather than driving a near-constant current through the (generally low) output impedance of the pulse generator. Also, extending the duration of a state representation (e.g., using multiple pulses instead of a single such pulse) can improve the robustness of data transmission, which may be important in noisy environments. An example of such an environment is power conversion systems in which power switches can at times switch currents and voltages that are two or more orders of magnitude larger than the currents and voltages used to control the switching. Such power conversion environments may be so noisy that it is advantageous to repeatedly transmit individual state representations to insure that data communication is effective.

In many implementations, the pulses in the multi-pulse state representation each have a relatively short duration such that the impedance of the transmitting inductor is on the same order as the output impedance of the pulse generator for the duration of the state representation.

In some implementations of the signal transmission system, the duration of the pulses of the state representation is short enough that the transistor(s) in the pulse generator that are responsible for generating the pulses never enter saturation. In this regard, larger signals are easier to discriminate from noise. One approach to ensuring that signals can be effectively transmitted across a magnetic coupling would thus be to increase the magnitude of the current passing through the transmitter-side inductor so as to induce a larger voltage change on the receiver-side inductor.

However, although the current carrying capacity of a transistor increases with increasing size, the rate at which such a transistor can be switched between conductive and non-conductive states decreases with increasing size. This may be particularly true for signal transmission systems using low transmitting inductances in the nano-Henry range. This may be due to the parasitic inductances provided by the package together with limited on-chip bypass capacitance, which lead to reduced capacity to charge or discharge a large transistor at a high speed or rate. As the rate at which such a transistor can be switched between conductive and non-conductive states decreases, the maximum rate of change in the transistor current will also decrease. With a decreased rate of change in the current through a transmitting inductor, the potential induced in the receiving inductor will also be decreased. There is thus a trade-off between the current carrying capacity of the transistors that generate pulses and the rate of change in the current carried by those transistors.

In some implementations of the signal transmission system, the duration of the pulses of the state representation is short enough that the transistor(s) in the pulse generator that are responsible for generating the pulses never enter saturation during a state representation. In other words, the pulses or other levels in the multi-level state representation may be short enough to reduce the required transmitter current while avoiding saturating the transmitter. The rate of increase of the transmitter current can thus be maintained sufficiently high so that the voltage amplitude of the received signal is also sufficiently high.

With the signal transmission circuitry representing a state with multiple upward transitions and downward transitions, the receiver (drive circuit) includes a state discriminator circuit that can discriminate between different state representations. For example, the state discriminator circuit can discriminate between different pulse densities of different multi-transition state representations, as discussed further below.

FIG. 1 illustrates a system 100 that includes a switch controller 102, a system controller 104, and a power switch 106 (illustrated as an IGBT). The switch controller 102 includes a transmitter 108 (also referred to as the driver interface), a receiver 110 (also referred to as the drive circuit) to receive information transmitted across the galvanic isolation, and an inductive coupling 112 that forms a communication link that bridges the galvanic isolation. As illustrated, the transmitter 108 includes a pulse generator 114. Receiver 110 includes a decoder circuit 116 and a power switch driver 118.

Further, inductive coupling 112 includes a transmit loop 111 and a receive loop 126. Inductive coupling 112 forms a communication link across the galvanic isolation between the transmitter 108 and the receiver 110. Transmit loop 111 may also be referred to as a primary loop/winding and receiver loop 113 may also be referred to as a secondary loop/winding. Loops 111, 113 can be magnetically coupled in a variety of different ways. For example, in some implementations, loops 111, 113 can be wound about a common high-magnetic-permeability core and form a transformer. However, in other implementations, loops 111, 113 need not share a common core. The strength of the magnetic coupling between loops 111, 113 is determined by several factors, including the nature of any core and surrounding medium, the geometry and disposition of loops 111, 113, the number of windings in loops 111, 113, and a variety of other factors. In some implementations, the strength of the magnetic coupling can be limited by the properties of the loops 111, 113. For example, as discussed further below, in some implementations, loops 111, 113 can each be single loop inductors formed at least in part by the lead frame of a semiconductor chip package (e.g., FIG. 6A) and have relatively small-inductances. As another example, loops 111, 113 can each be inductors formed at least in part by the top metallization layer of a semiconductor chip (e.g., FIG. 6B). Such loops 111, 113 can have relatively small inductances, e.g., inductances of 50 nH or less or 20 nH or less.

FIG. 1 also illustrates:
- a voltage $V_{CE}$ 105 that is across power switch 106,
- a current $I_{CE}$ 107 that flows between the main terminals of power switch 106,
- one or more system inputs 120 that represent information that can be used by system controller to generate a signal that indicates whether power switch 106 should be ON or OFF,
- input signal $U_{IN}$ 122 that indicates whether power switch 106 should be ON or OFF,
- transmit voltage $V_T$ 124 that is applied across transmit loop 111 by pulse generator 114 of transmitter 108,
- transmit current $I_T$ 125 that is conducted through transmit loop 111 as a result if the application of transmit voltage $V_T$ 124 thereto by pulse generator 114,
- receiver voltage $V_R$ 126 that is induced in receiver loop 126 by changes in transmit current $I_T$ 125,
- decoded signal $U_{DEC}$ 128 that is yielded by the decoding of receiver voltage $V_R$ 126 by decoder circuit 116, and
- drive signal $U_D$ 130 that is output by driver 118 to drive power switch 106.

In operation, system controller 104 is coupled to receive system inputs 120. System controller 104 determines whether the switch controller 102 should turn ON or turn OFF the power switch 106 based on system inputs 120 and generate an input signal $U_{IN}$ 122 that characterizes the results of that determination. Example system inputs 120 include the pulse width modulated (PWM) signal for a general purpose motor drive, a turn on and turn off sequence of a multi-level power converter, or a system fault turn-off request.

In the illustrated system 100, system controller 104 outputs input signal $U_{IN}$ 122 to switch controller 102. Input signal $U_{IN}$ 122 may be a rectangular pulse waveform that includes logic high and logic low sections of varying durations. For example, logic high values may indicate that power switch 106 is to be in the ON state. Logic low values may indicate that power switch 106 is to be in the OFF state. The durations of the logic high/logic values can correspond to the desired driving of power switch 106.

Transmitter 108 of switch controller 102 is coupled to receive input signal $U_{IN}$ 122. In some cases, the transmitter 108 may be a driver interface. Transmitter 108 encodes input signal $U_{IN}$ 122 for transmission over inductive coupling 112. The encoding of input signal $U_{IN}$ 122 yields state representations that include multiple upward transitions and multiple downward transitions within the representation of individual states. In the illustrated example, the transmitter 108 uses a pulse generator 114 to generate a transmit voltage $V_T$ 124 with varying levels (i.e., a multiple pulses) in each state representation. In this case, transmit voltage $V_T$ 124 will be multiple pulses that encode a single information state.

As described further below, if input signal $U_{IN}$ 122 indicates that the power switch 106 should transition from an OFF state to an ON state, then transmit voltage $V_T$ 124 can include multiple upward transitions and multiple downward transitions within a state representation of a first duration, where the first duration is the product of the number of pulses and the period of those pulses (shown as duration $T_0$ 242 in FIG. 2). In some cases, the multi-transition state representation for a transition from an OFF state to an ON state may include M pulses. The period of a pulse is the sum of the duration of a pulse width (i.e., the time when pulse generator 114 is applying a voltage and outputting current to the transmitting inductor) and the time between the pulse widths (i.e., the duration of time when pulse generator 114 is no longer applying a voltage). In general, the time between pulse widths has a minimum duration in which the magnetic field stored in the inductor during the application of a voltage is driven to near zero or allowed to drop to near zero.

When the input signal $U_{IN}$ 122 indicates that the power switch 106 should be transitioned from an ON state to an OFF state, then transmit voltage $V_T$ 124 can include a multi-pulse representation of a second duration, where the second duration is the product of the number of pulses and the period of those pulses. In one case, the multi-pulse state representation for a transition from an ON state to an OFF state may include N pulses. In some implementations, the number of pulses M and N are not equal. The first and second duration (and as such number of pulses M and N) may not be equal to differentiate between the multi-pulse states representing a transition from an ON state to an OFF state and vice versa.

In some implementations, the multi-pulse state representations indicating that a transition should occur can be repeated so long as the input signal $U_{IN}$ 122 indicates that the power switch 106 need not transition out of the current state. As illustrated, e.g., in FIGS. 2, 3A, 3B, 5A, 5B, multi-pulse state representations indicating that a transition should occur can be repeated to help ensure that that the multi-pulse state representation may be received and decoded in the presence of noise. In addition, the multi-pulse state representations may also be repeated to provide a signal that can be used by the receiver to synchronize with the state-representation repetition frequency of the transmitter. For noisy environments, in particular in the context of power converters, the repetition of the multi-pulse state representation may also ensure that the transmitted signal is not lost.

Figure 6A:
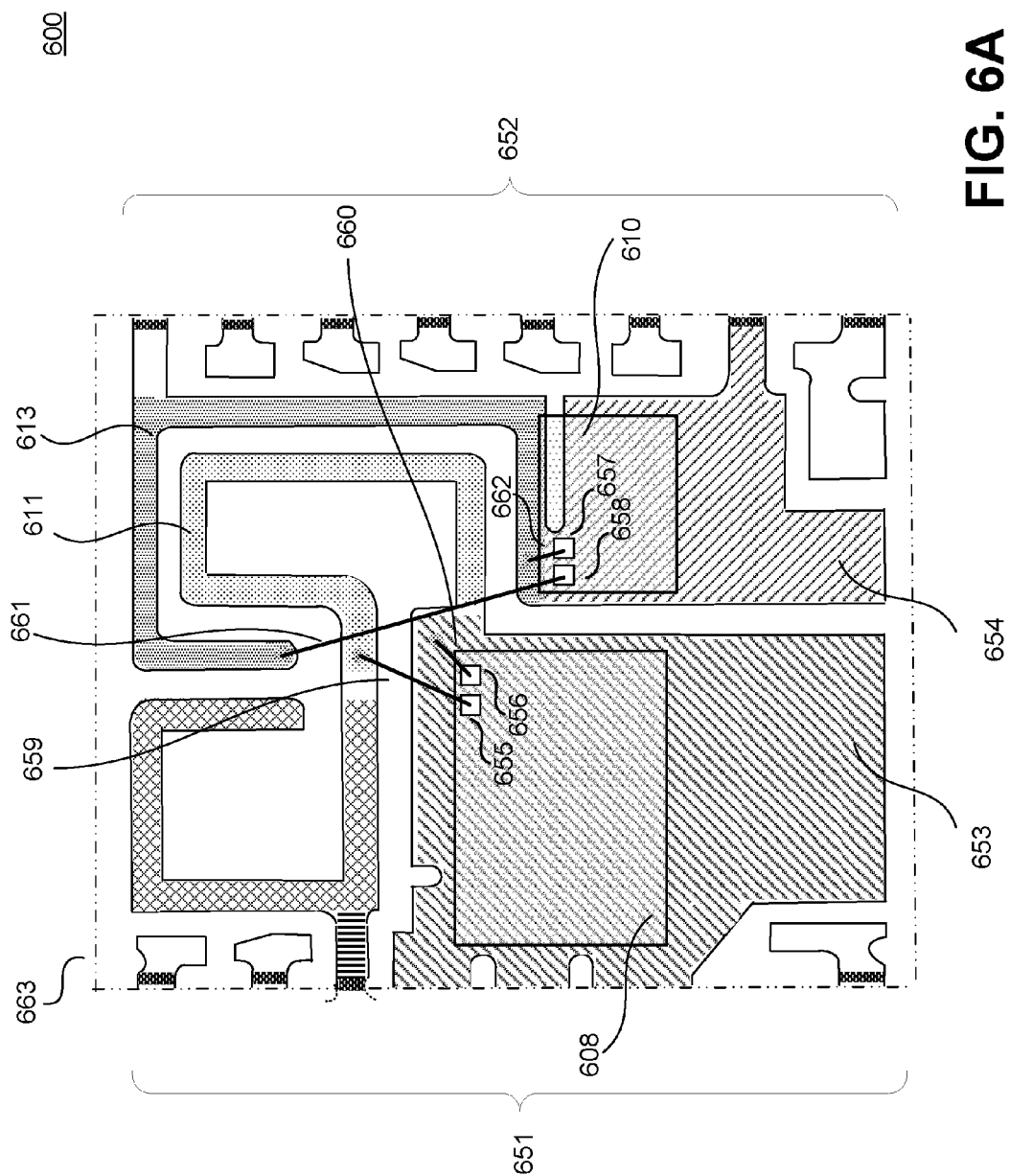
FIG. 6A is a schematic representation of an example lead frame of an integrated circuit package illustrating an example inductive coupling between dice, in accordance with teachings of the present invention.
Figure 6B:
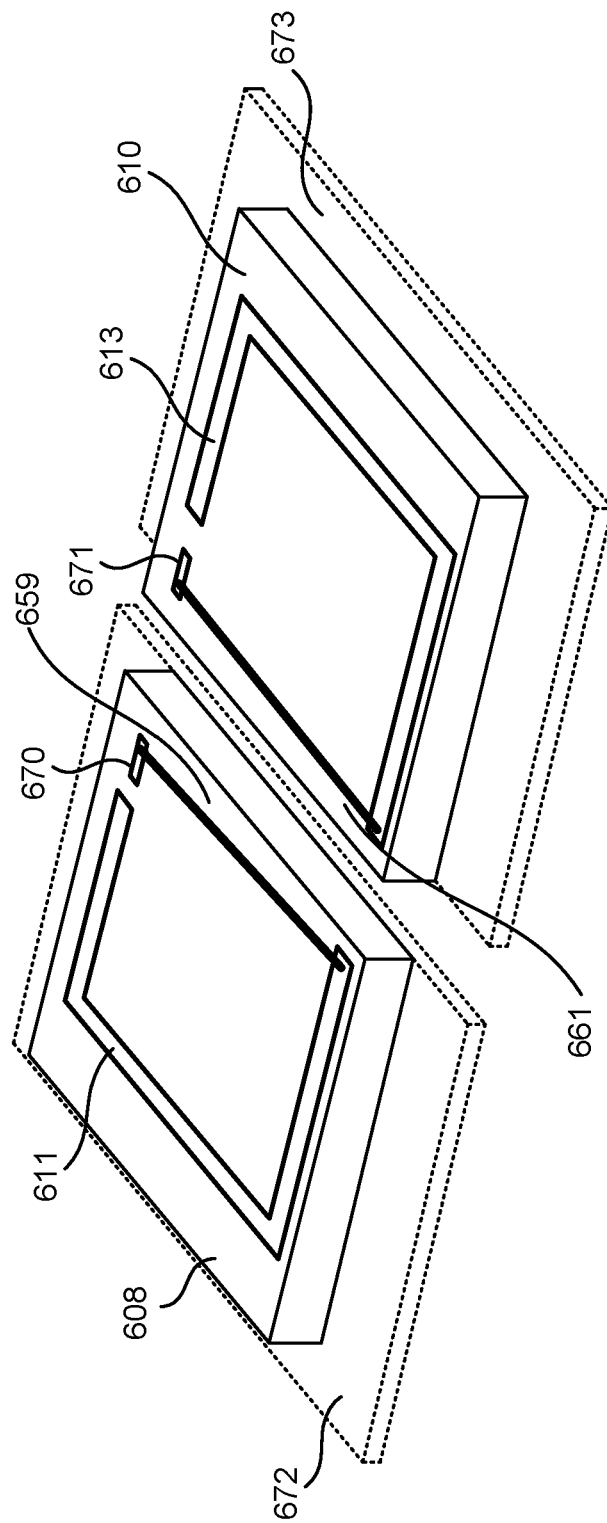
FIG. 6B is a schematic representation of an example coupling between dice of within integrated circuit package, in accordance with teachings of the present invention.

Transmitter 108 transmits the transmit voltage $V_T$ 124 to the receiver 110 via the magnetically coupled loops 111, 126 of inductive coupling 112. In some cases, the receiver 110 may be a drive circuit. In the illustrated example, the multi-pulse state representation of the transmit voltage $V_T$ drives a changing transmitter current $I_T$ 125 through transmit loop 111, which induces voltage $V_R$ 126 in receiver loop 113. As such, the receiver 110 receives information from transmitter 108. As discussed further, transmit loop 111 and receive loop 113 can in some implementations be formed using a lead frame within an integrated circuit package (FIG. 6A) or the top metallization of silicon of an integrated circuit (FIG. 6B).

In the illustrated implementation, receiver circuit 110 includes decoder circuit 116 and driver 118. Driver 118 outputs the drive signal $U_D$ 130. Drive signal $U_D$ 130 is coupled to be received at the control terminal of power switch 106 control the switching of the power switch 106. In the illustrated implementation, power switch 106 is an IGBT and drive signal $U_D$ 130 is received at the gate-terminal of the IGBT 106. Decoder circuit 116 is coupled to receive the receiver signal $V_R$ 126 and determine whether the received signal $V_R$ 126 indicates that the power switch 106 should transition from an ON state to an OFF state or vice-versa. Decoder circuit 116 outputs decoded signal $U_{DEC}$ 128 that characterizes the results of this determination. In one example, decoder circuit 116 includes a pulse density determination circuit to differentiate the varying number of transitions within the multi-pulse state representation of the transmit voltage $V_T$ 124. Driver 118 is coupled to receive the decoded signal $U_{DEC}$ 128 and output the drive signal $U_D$ 130.

Figure 2:
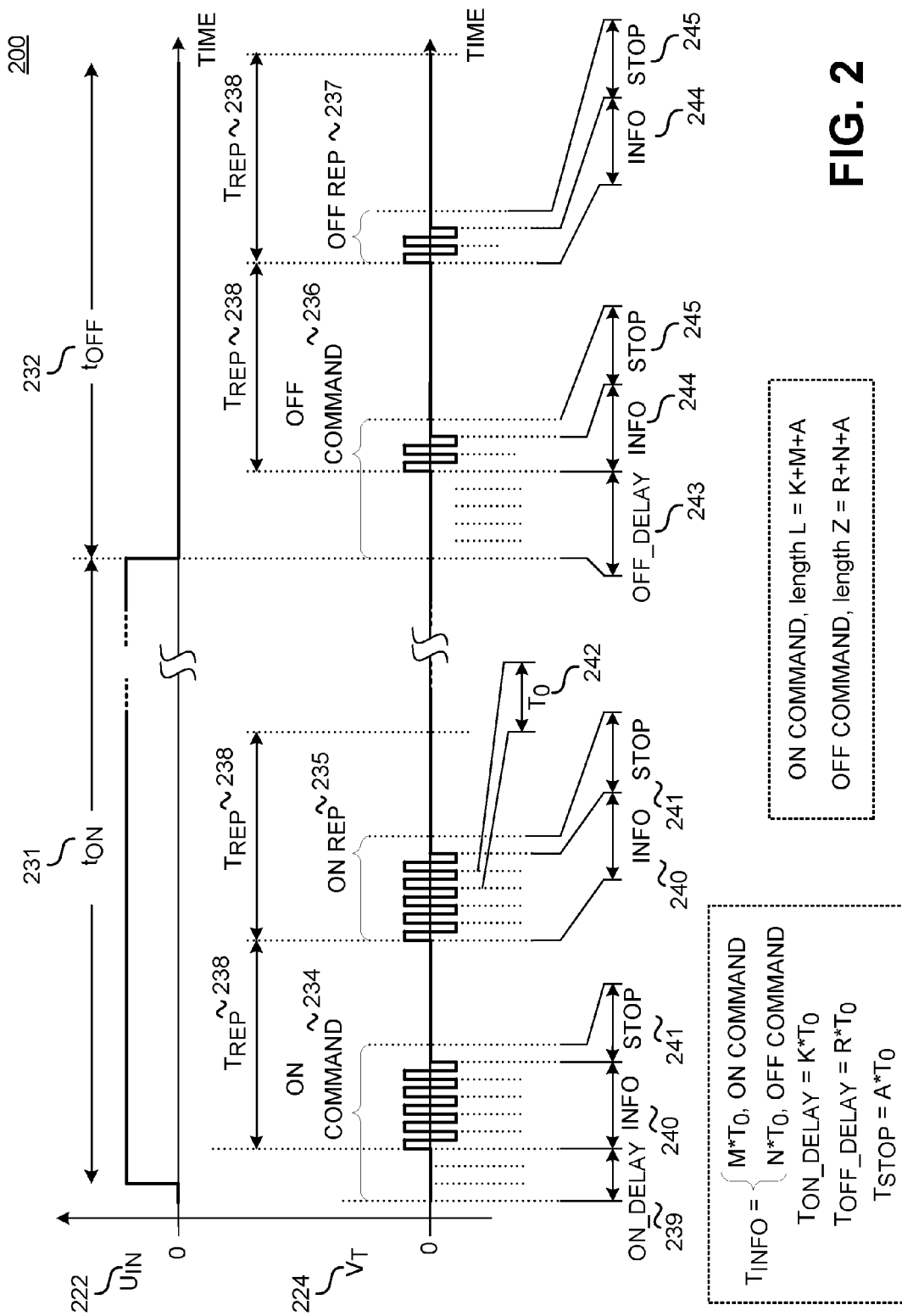
FIG. 2 illustrates a timing diagram showing example waveforms of an input signal and transmit signal which illustrate various commands, in accordance with teachings of the present invention.

FIG. 2 illustrates a timing diagram 200 showing an example transmit signal $V_T$ 224 that is output by pulse generator 114. In the illustrated implementation, input signal $U_{IN}$ 222 is a rectangular waveform with high potential portions and low potential portions. In the illustrated example, a higher potential portion of the input signal $U_{IN}$ 222 corresponds to a time when the power switch should in theory be ON whereas a lower potential portion corresponds to a time when the power switch should in theory be OFF. In the absence of communication, propagation, and other delays, the durations of the higher and lower potential sections would thus correspond to the on-time $T_{ON}$ 231 and off-time $T_{OFF}$ 232 (or vice versa in a circuit with inverse logic states). The transmit signal $V_T$ 224 may also be a rectangular waveform with high potential portions and low potential portions. For the sake of convenience, the higher potential portions of the transmit signal $V_T$ 224 are hereinafter referred to as times during which pulse generator 114 is applying a positive voltage and outputting a like-directed current to the transmitting inductor, whereas the lower potential portions of the transmit signal $V_T$ 224 are hereinafter referred to as times during which pulse generator 114 allows a negative voltage and the inductor current reduces to near zero in the transmitting inductor. It is to be understood that this designation is arbitrary and that pulse generator could, e.g., initially apply a negative voltage. Further, in the FIGS., the higher potential portions are the portions of the transmit signal $V_T$ 224 which are greater than "0" while the lower potential portions are the portions of the transmit signal $V_T$ 224 which are greater than "0." In other words, the higher potential portion may refer to a time when the pulse generator 114 is applying or allowing one voltage and corresponding current while the lower potential portions may refer to times which the pulse generating 114 is applying or allowing another voltage and corresponding current.

In addition, although pulses are shown as idealized rectangular pulses, such pulses will generally not be obtained in real-world systems. For example, the pulses in transmit signal $V_T$ 224 may only approximate rectangular or may have another shape altogether (e.g., approximately sawtooth, approximately trapezoidal, or approximately sinusoidal). Further, other shapes may also be used.

When the input signal $U_{IN}$ 222 transitions to a logic high value, pulse generator 114 responds by outputting an ON command 234 onto transmit loop 111. In the illustrated implementation, ON command 234 includes multiple portions, namely, an on-delay 239, an information portion 240, and a stop portion 241. Each portion has a duration that is a fraction of the repetition period $T_{REP}$ 238. Information portion 240 can have a duration of $M*T_0$ or greater, where M is the number of pulses and $T_0$ is the period of those pulses. The period $T_0$ of a pulse is the sum of the duration of a pulse width (i.e., the time when pulse generator 114 is applying a positive voltage and outputting current to the transmitting inductor) and the time between the pulses (i.e., the time when pulse generator 114 allows a negative voltage and the current in the transmitting inductor returns to approximately zero). The time $T_0$ may thus be defined by the sum of the time required for the impedance of transmit loop 111 to fall below the output impedance of the pulse generator 114 and the time required for the magnetic field stored in transmit loop 111 to return to approximately zero (or other baseline level). Thus, information portion 240 for ON command 234 can include M pulses and can have a duration that is substantially equal to $M*T_0$. In one example, M may be $3*2^3$. The value of M may be a multiple of a power of two when using digital counters included in the pulse generator. However, uneven values for M may also be used.

On-delay portion 239 does not include any pulses and has a duration that allows the information portion 244 and stop portion 245 of an OFF command 236 that has already started to finish before the information portion 240 of an ON command 234 begins. On-delay portion 239 thus serves to prevent conflicts between the information portion 244 and stop portion 245 of an OFF command 236 that is ending and the information portion 240 of an ON command 234 that is beginning. Such a conflict is particularly likely where state representations are repeatedly transmitted to ensure reception. The duration of the on-delay portion 239 is at least as long as the sum of the duration of the information portion 244 and the stop portion 245 of the OFF command Or in other words, the on-delay portion 239 can have a minimum duration that is substantially equal to or greater than $(A+N)*T_0$, where N is the number of pulses in an OFF command 236.

Stop portion 241 also does not include any pulses and has a duration that is selected to be at least as long as the shortest portion which may be detected safely, such as the length of the information portion 244 of the off command 236. Stop portion 241 can have a duration that is substantially equal to $A*T_0$. Thus, in some instances, the overall duration of ON command 234 may be $(M+N+2A)*T_0$ or greater. In some cases, A can be substantially equal to N.

In examples of the present invention, the transmitter repeats the information portion 240 and the stop portion 241 every repetition period $T_{REP}$ 238. The repeated signal may be referred to as an ON repetition 235. As shown, the time between the upward transition of the first pulse of the information portion 240 of ON command 234 and the upward transition of the first pulse of the information portion 240 of the ON repetition 235 is substantially equal to the repetition period $T_{REP}$ 238.

When the input signal $U_{IN}$ 222 transitions to a logic low value, the transmitter outputs OFF command 236. OFF command 236 also includes multiple portions, namely, off delay 243, information portion 244, and stop portion 245. Information portion 244 of OFF command 236 is a multipulse state representation that include N pulses and has a duration that is substantially equal to $N*T_0$. In one example, N may be equal to $2^3$. In some cases, the values for M and N are not equal and M may be greater than N. The values of M and N are selected such that the receiver circuit may distinguish between an ON command and an OFF command. In one example, M is three times greater than N.

The off-delay 243 does not include any pulses and has a duration that allows the information portion 240 and the stop portion 241 of an ON command 234 that has already started to finish before the information portion 244 of an OFF command 236 begins. Off-delay 243 thus serves to prevent conflicts between the information portion 244 of an ON command 234 that is ending and the information portion 244 of an OFF command 236 that is beginning. The duration of off-delay 243 is at least as long as the duration of the information portion 240 and stop portion 241 of the ON command 234. In other words, off-delay 243 can have a duration that is substantially equal to or greater than $(M+A)*T_0$, where M is the number of pulses in an ON command 234.

Stop portion 245 also does not include any pulses and has a duration that is selected to be at least as long as the shortest portion which may be detected safely, such as the length of the information portion 244 of the off command 236. Stop portion 245 can have a duration that is substantially equal to $A*T_0$. Thus, in some instances, the overall duration of the OFF command 236 may be $(N+M+2A)*T_0$ or greater. In some cases, A can be substantially equal to N.

In examples of the present invention, the transmitter repeats the information portion 244 and the stop portion 245 every repetition period $T_{REP}$ 238. The repeated signal may be referred to as the OFF repetition 237. As shown, the time between the upward transition of the first pulse of the information portion 244 of the OFF command 236 and the upward transition of the first pulse of the information portion 240 of the OFF repetition 237 is substantially equal to the repetition period $T_{REP}$ 238.

In one example, the receiver detects that the state of the input signal $U_{IN}$ 222 has changed at the end of an information portion 240 of the ON command 234 or the end of the information portion 244 of the OFF command 236. As such, there is a delay between the input signal $U_{IN}$ 222 transitioning states and when the receiver detects the state change.

As discussed above, the durations of the on delay portion 239 and the off delay portion 243 can be chosen to prevent potential collisions during a transition between logic states of the input signal $U_{IN}$ 222. The duration of the on-delay 239 should be greater than or equal to the sum of the length $N*T_0$ of the information portion 244 and the duration $A*T_0$ of the stop portion 245, or mathematically: $\geq N+A$. Similarly the duration of the off-delay 243 should be greater than or equal to the sum of the information portion 240 duration ($M*T_0$) and the stop portion 241 duration ($A*T_0$), or mathematically: $\geq M+A$. Using the on-delay 239 and the off-delay 243 to prevent collisions may increase the overall delay between the input signal $U_{IN}$ 222 transitioning states and when the receiver detects the state change.

In some implementations, the transmitter adds delays at the beginning of an ON command or an OFF command only if a collision is detected. However, this may result in varying delay times between the input signal $U_{IN}$ transitioning states and the receiver detecting the state change. The on-delay 239 and the off-delay 243 portions may thus instead substantially fix the length of delay between the input signal $U_{IN}$ 222 transitioning states and the receiver detecting the state change.

Figure 3A:
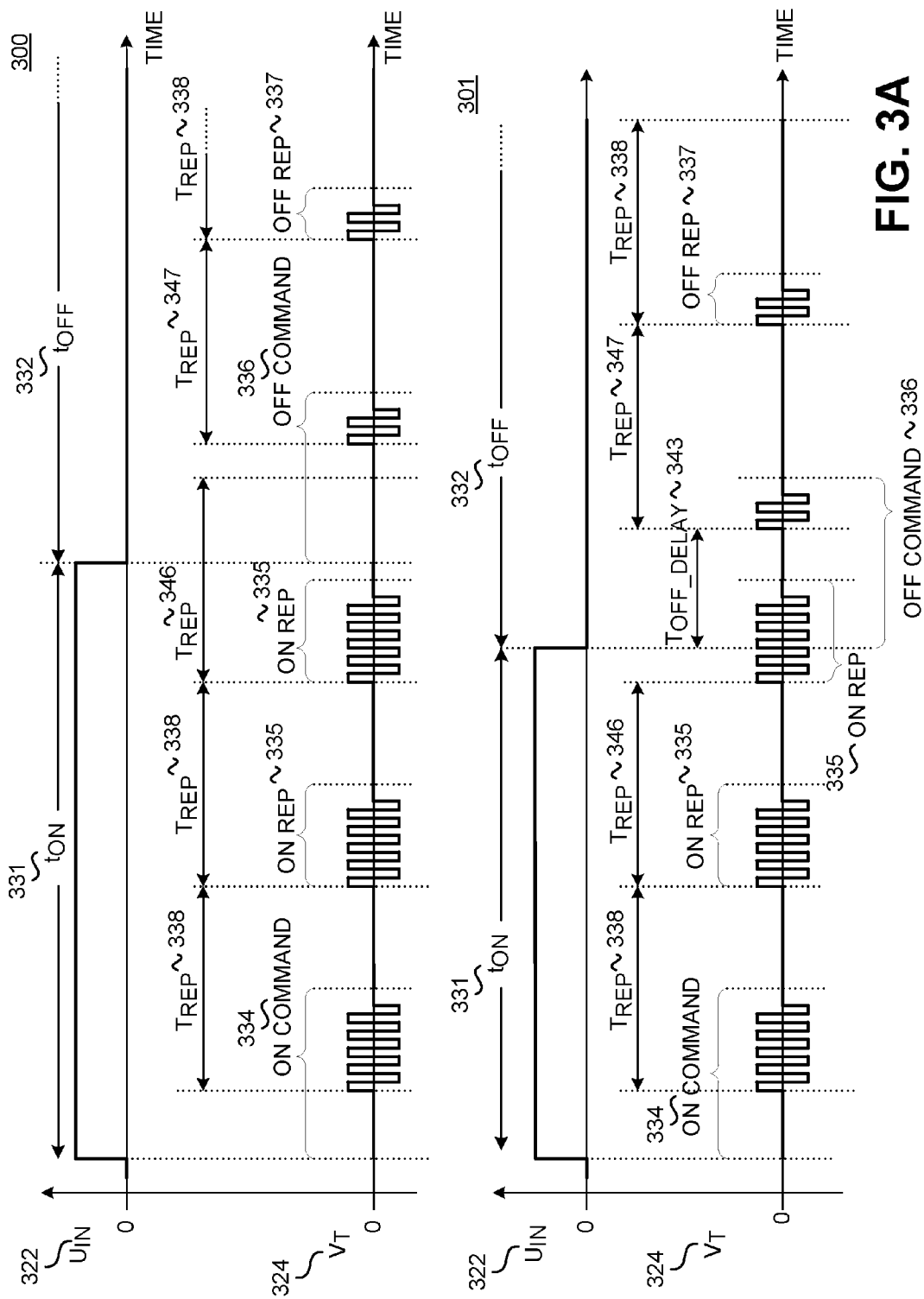
FIG. 3A illustrates a timing diagram showing example waveforms of the input signal and transmit signal which illustrates how collisions between various commands can be avoided during a transition from an ON state to an OFF state, in accordance with teachings of the present invention.

FIG. 3A illustrates timing diagrams 300 and 301 and how collisions between commands and repetitions are avoided during a logic high to a logic low transition. Timing diagram 300 illustrates the input signal $U_{IN}$ 322 and the transmit signal $V_T$ 324 when the input signal $U_{IN}$ 322 transitions from logic high to logic low after an ON repetition 335. As shown, when the input signal $U_{IN}$ 322 is logic high, an ON command 334 followed by several ON repetitions 335 are illustrated on the transmit signal $V_T$ 324. The time between the start of consecutive information portions is substantially the repetition period $T_{REP}$ 338. In other words, the first ON repetition 335 begins after a time $T_{REP}$ 338 from the beginning of the information portion of ON command 334. The second ON repetition 335 also begins after a time $T_{REP}$ 338 from the beginning of the first ON repetition 335.

The second ON repetition 335 triggers the beginning of another repetition period $T_{REP}$ 346. As illustrated, the input signal $U_{IN}$ 322 transitions to a logic low value after the ON repetition 335. The beginning of the OFF command 336 begins at the time when input signal $U_{IN}$ 322 transitions to a logic low value. A new repetition period $T_{REP}$ 347 begins at the beginning of the information portion of the OFF command 336. At the end of the repetition period $T_{REP}$ 347, another repetition period $T_{REP}$ 338 begins and an OFF repetition 337 is illustrated on the transmit signal $V_T$ 324. The end of the ON repetition 335 and the start of the OFF command 336 do not overlap.

Timing diagram 301 illustrates what occurs when the input signal $U_{IN}$ 322 transitions from logic high to logic low before the end of the information portion of an ON repetition 335. The input signal $U_{IN}$ 322 transitions to a logic low value before the end of the information portion of the second ON repletion 335. As such, the OFF command 336 and the second ON repetition 335 overlap. However, due to the off delay bit with length $T_{OFF\_DELAY}$ 343 the information portion of the second ON repletion 335 and the information portion of the OFF command 336 do not collide.

Figure 3B:
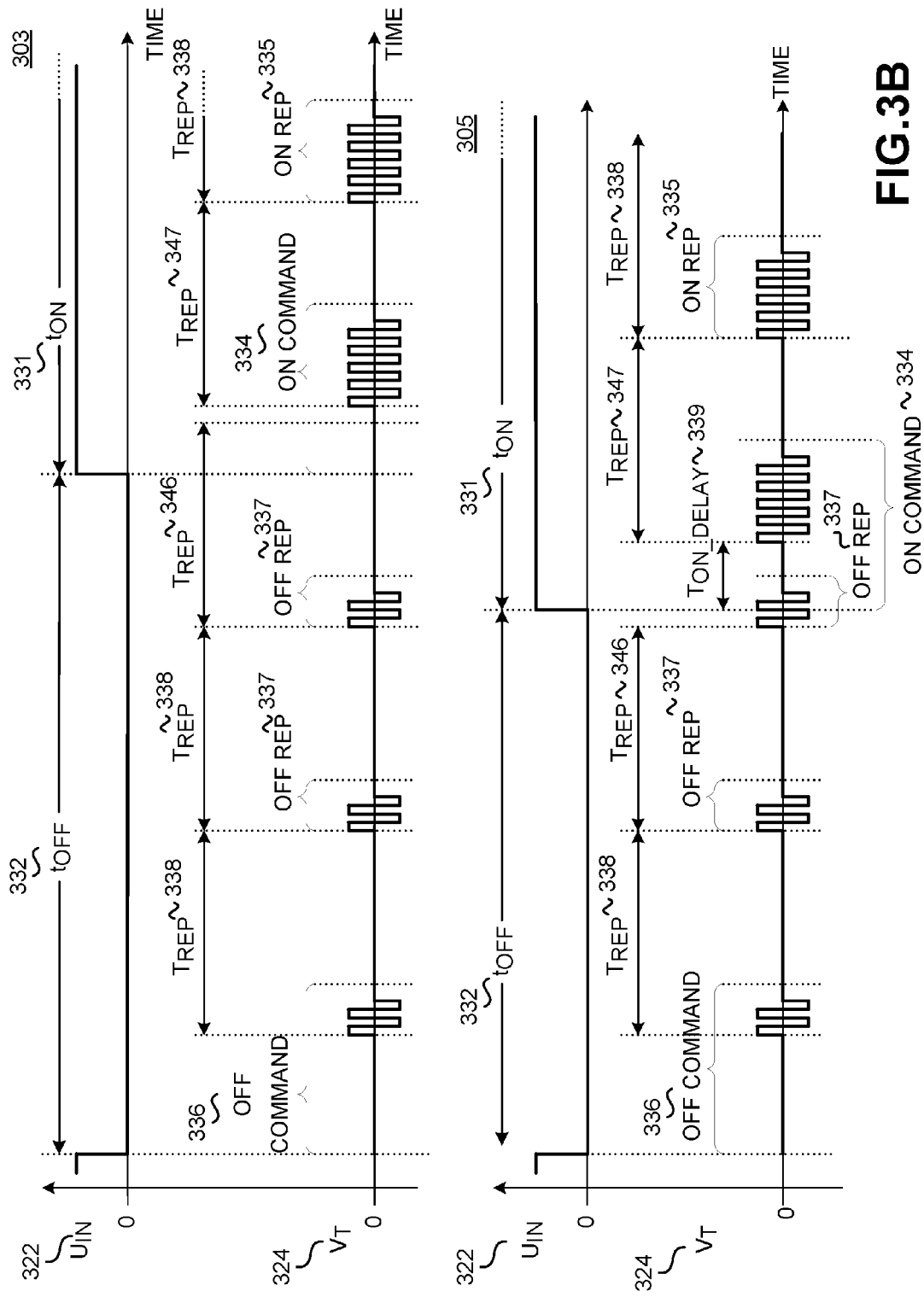
FIG. 3B illustrates a timing diagram showing example waveforms of the input signal and transmit signal, and illustrates how collisions between various commands are avoided during a transition from an OFF state to an ON state, in accordance with teachings of the present invention.

FIG. 3B illustrates timing diagrams 303 and 305 and how collisions between commands and repetitions are avoided during a logic low to logic high transition. Timing diagram 303 illustrates the input signal $U_{IN}$ 322 and the transmit signal $V_T$ 324 when the input signal $U_{IN}$ 322 transitions from logic low to high after the information portion of an OFF repetition 337. As shown, when the input signal $U_{IN}$ 322 is logic low, an OFF command 336 followed by several OFF repetitions 337 are illustrated on the transmit signal $V_T$ 324. The first OFF repetition 337 begins after a time $T_{REP}$ 338 from the beginning of the information portion of the OFF command 336. Further, the second OFF repetition 337 begins after a time $T_{REP}$ 338 from the beginning of the first OFF repetition 337.

The second OFF repetition 337 triggers the beginning of another repetition period $T_{REP}$ 346. As illustrated, the input signal $U_{IN}$ 322 transitions to a logic high value after the second OFF repetition 337. The beginning of the ON command 334 begins at the time when input signal $U_{IN}$ 322 transitions to a logic high value. A new repetition period $T_{REP}$ 347 begins at the beginning of the information portion of the ON command 334. At the end of the repetition period $T_{REP}$ 347, another repetition period $T_{REP}$ 338 begins and an ON repetition 335 is illustrated on the transmit signal $V_T$ 324. The end of the OFF repetition 337 and the start of the ON command 334 do not overlap.

Timing diagram 305 illustrates what occurs when the input signal $U_{IN}$ 322 transitions from logic low to high before the end of the information portion of an OFF repetition 337. The input signal $U_{IN}$ 322 transitions to a logic high value before the end of the information portion of the second OFF repetition 337. As such, the ON command 334 and the second OFF repetition 337 overlap. However, due to the on delay bit with length $T_{ON\_DELAY}$ 339 the information portion and stop portion of the second OFF repetition 337 and the information portion of the ON command 334 do not collide.

Figure 4:
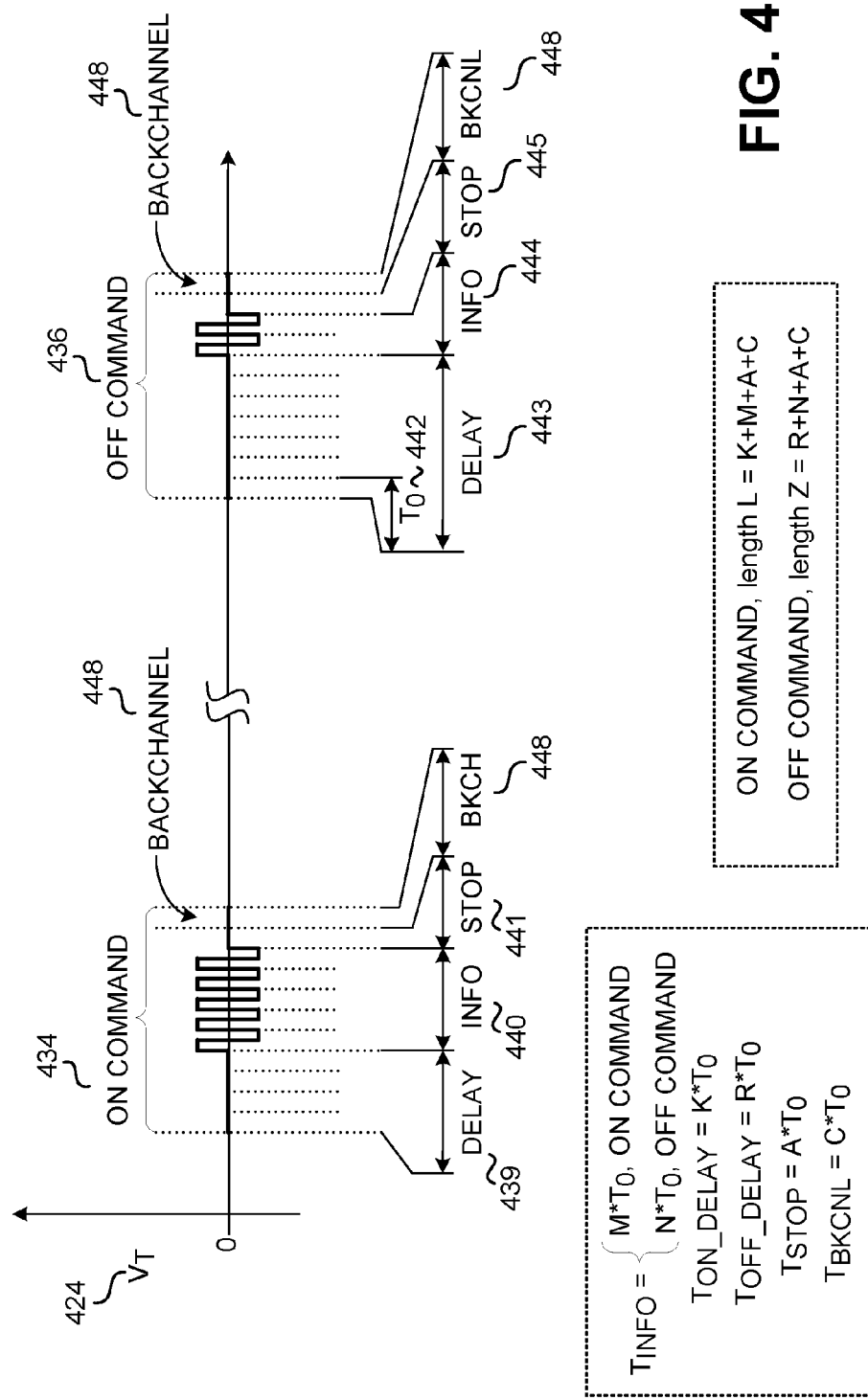
FIG. 4 is a timing diagram showing an example ON command and example OFF command with a backchannel portion, in accordance with teachings of the present invention.

FIG. 4 illustrates a timing diagram 400 illustrating example ON command 434 and OFF command 436 with an added backchannel portion 448. As shown, both the ON command 434 and OFF command 436 may include a backchannel portion 448 of length $C*T_0$. As such, the total minimum duration of the ON command 434 may be $(N+M+2A+C)*T_0$ and the total minimum duration of the OFF command 436 may be $(M+N+2A+C)*T_0$. The backchannel portion 448 may be utilized as a restricted period during which the circuitry which initially acted as the receiver (e.g., drive circuit 110 in FIG. 1) can send information back to the circuitry which initially acted as the transmitter (e.g., driver interface 108 in FIG. 1) without fear of collision.

In some cases, the receiver may send a fault command to the transmitter. The fault command may be used to notify the transmitter of a critical fault condition, such as a power switch short-circuit or over-voltage condition. The fault command may be characterized by a long sequence of pulses which is longer than any command pulse sequence (such as the ON command, ON repetition, OFF command, OFF repetition, and CS command). As such, the transmitter may recognize this long sequence of pulses since a fraction of the long sequence is received and not interfered with a command being current sent.

Figure 5A:
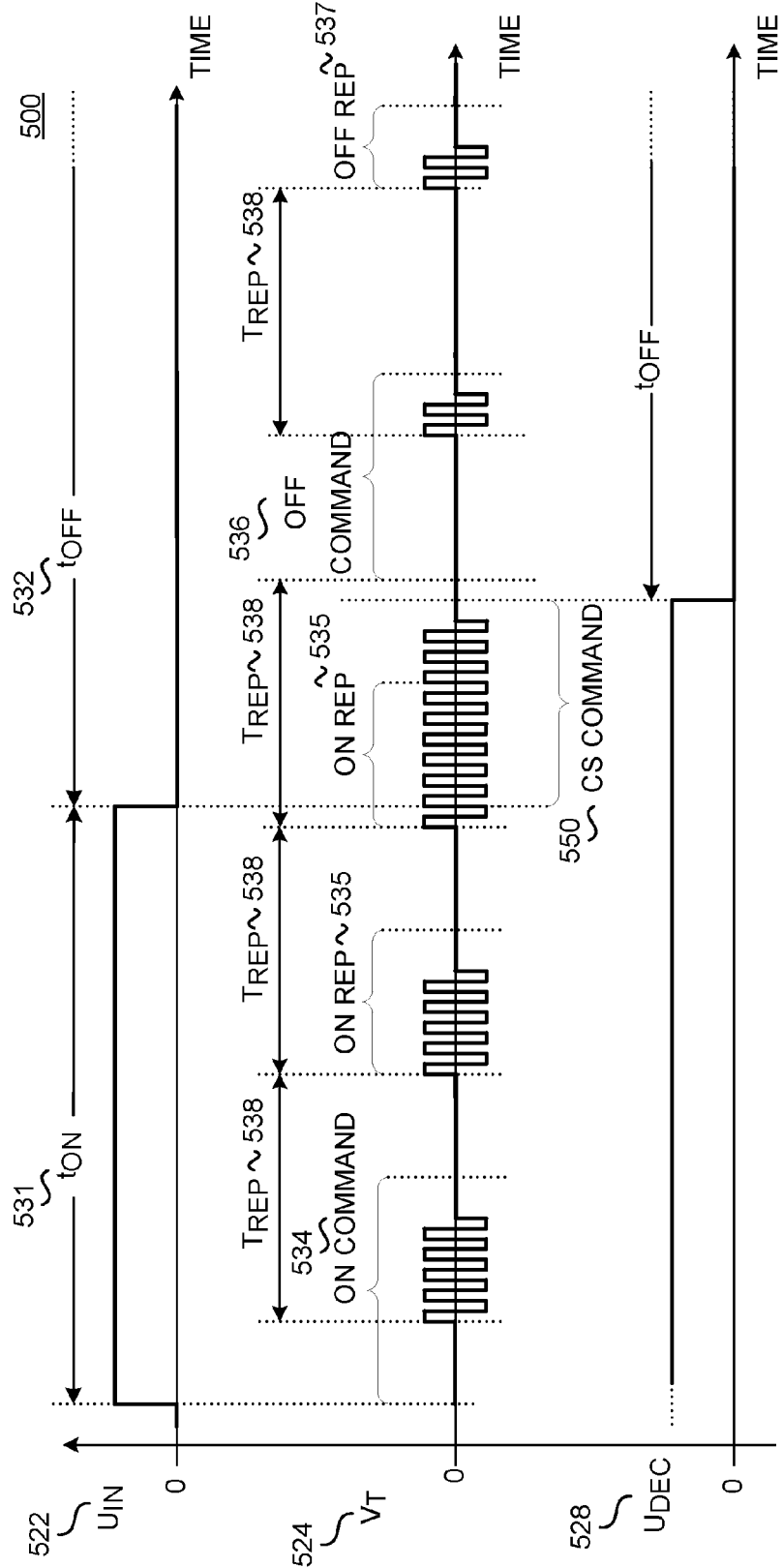
FIG. 5A is a timing diagram showing example waveforms of the input signal and transmit signal which illustrate a change state command from an ON state to an OFF state, in accordance with teachings of the present invention.
Figure 5B:
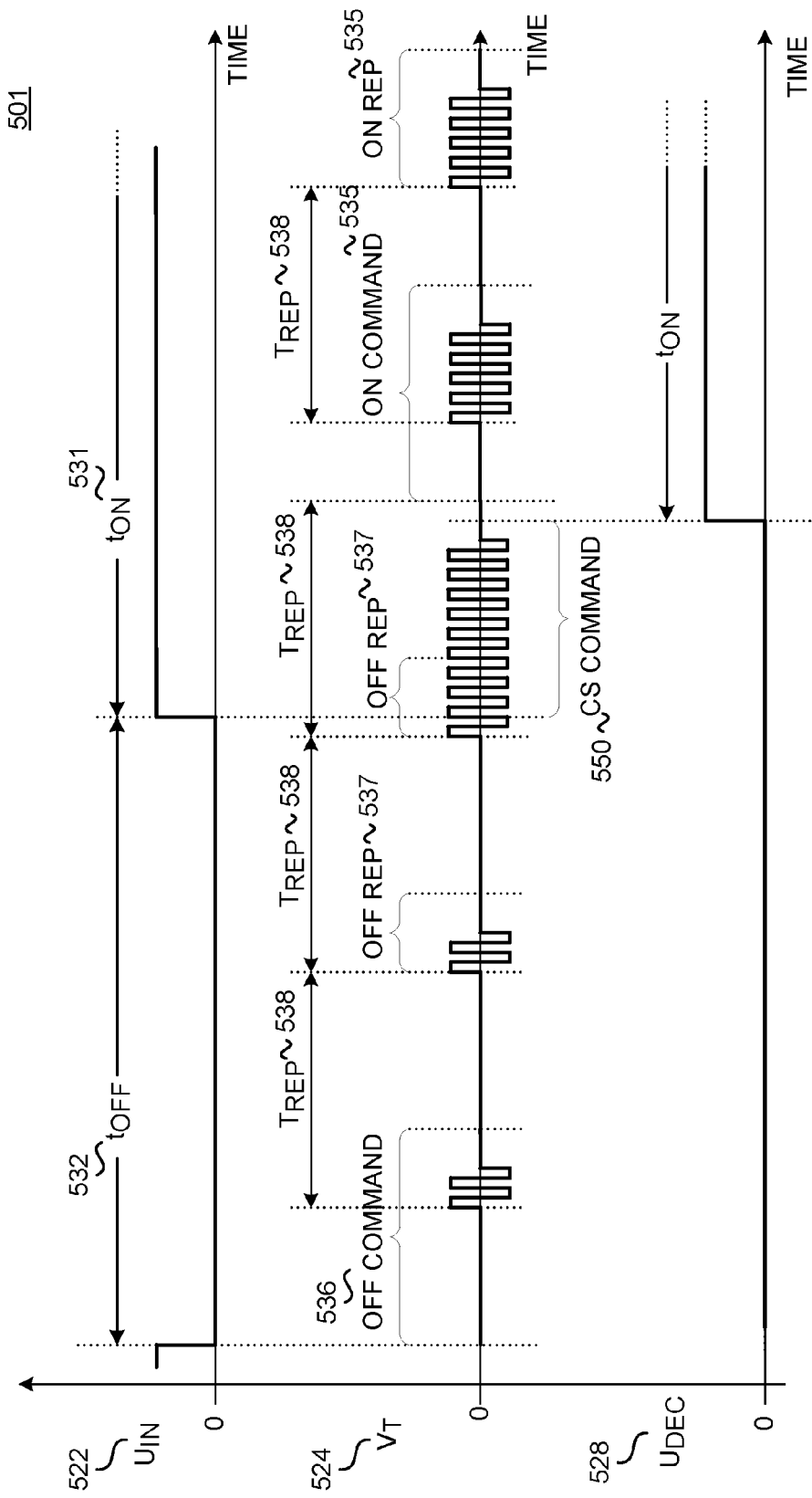
FIG. 5B is a timing diagram showing example waveforms of the input signal and transmit signal which illustrate a change state command from an OFF state to an ON state, in accordance with teachings of the present invention.

FIG. 5A and FIG. 5B illustrate timing diagrams 500 and 501 of the input signal $U_{IN}$ 522 and the transmit signal $V_T$ 524 that include a change state command 550. FIG. 5A illustrates the use of a change state command 550 during a logic high to logic low transition in the input signal $U_{IN}$ 522 whereas FIG. 5B illustrates the use of a change state command 550 during a logic low to high transition in input signal $U_{IN}$ 522. A change state command 550 is a single command that follows either an ON repetition 535 or an OFF repetition 537 and indicates that that a transition in the state of the power switch is to occur. In the following example, change state command 550 is identical regardless of whether the transition in the power switch is to be between ON and OFF states or between OFF and ON states. Change state command 550 can thus be thought of as a superposition of at least part of an ON repetition 535 and an OFF command 536, or vice-versa.

In the absence of additional information (i.e., the present state of the power switch), change state command 550 merely indicates that a transition is to occur but does not by itself indicate the state into which the power switch is to transition. Such a change state (CS) command 550 can decrease the delay between the input signal $U_{IN}$ 522 indicating that a state transition is to occur and the receiver receiving notice thereof and implementing the indicated transition.

For the examples shown in FIGS. 5A and 5B, the input signal $U_{IN}$ 522 transitions to a different logic state in the midst of the multi-level state information portion of both an ON repetition 535 and an OFF repetition 537. In response to the input signal $U_{IN}$ 522 transitioning to a different logic state, the pulse generator outputs CS command 550. CS command 550 elongates either the ON repetition 535 or the OFF repetition 537 that are being transmitted at that time. The CS command 550 acts as yet another multi-level state representation which can be differentiated from the multi-level state representations of ON command 534, ON repetition 535, OFF command 536, and OFF repetition 537. The CS command 550 may also include a stop portion. In general, the duration of the CS command 550 is longer than the duration of ON command 534 and OFF command 536, as well as the respective repetitions 535, 537.

CS command 550 includes at least some of the pulses in the information portion of the ON repetition 535 or the OFF repetition 537 that was ongoing during the transition in the input signal $U_{IN}$ 522. Additional pulses follow the pulses of the respective repetition to represent the change in state. In effect, CS command 550 extends the repetition 535, 537 that was ongoing at the time to represent different information (i.e., the change in state) without the delay associated with completing the repetition 535, 537. Thus, if the duration of the change state command 550 is less than sum of the duration of the remaining portion of the ongoing repetition 535, 537 and the next ON command 534 or OFF command 536, the delay between transitions in input signal $U_{IN}$ 522 and transitions in the state of a power switch can be decreased. FIGS. 5A and 5B illustrate example decoded signal $U_{DEC}$ 528 which changes state at the end CS command 550.

Figure 6C:
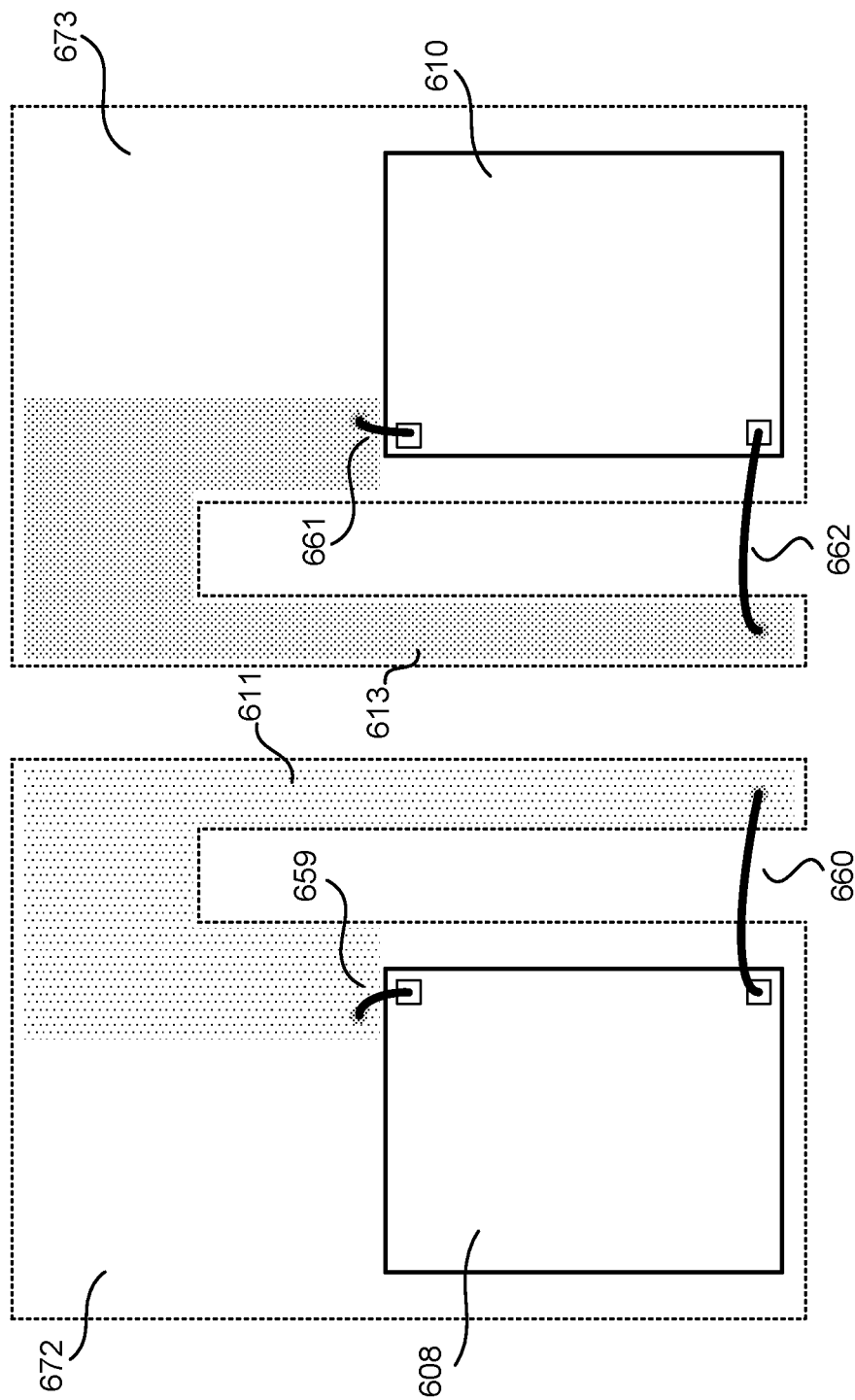
FIG. 6C is a schematic representation of an example configuration of a communication link that uses the lead frames which support the transmitter die and the receiver die.

In some cases, the CS command may be implemented by quickly repeating the information portion of the shortest command (in this example, the OFF repetition 537) but with a different length. As an example, the CS command may resemble the OFF repetition 537 with a delay portion before the information portion and a stop portion. As such, the CS command may be distinguishable from the other commands due how quickly the CS command is received after a repetition. For example, the receiver generally knows when a repetition will be received. A command received prior to the end of the repetition period $T_{REP}$ 538, for example as early as one quarter of the repetition period $T_{REP}$ 538, may be interpreted as a CS command FIGS. 6A, 6B, and 6C illustrate an example inductive coupling between a transmitter 608 and a receiver 610 within an integrated circuit package. In FIG. 6A, the inductive coupling includes a transmit loop 611 and a receiver loop 613 that are defined in the lead frame 600 of the integrated circuit package. FIG. 6A is a top down perspective of the inductive coupling. Lead frame 600 is disposed substantially within an encapsulated portion 663 of an integrated circuit package. In the illustrated implementation, the lead frame 600 includes a first conductor including the transmit loop 611 and a second conductor including the receiver loop 613. The second conductor of the lead frame is galvanically isolated from the first conductor. Transmitter conductive loop 611 is disposed proximate to the receiver conductive loop 613 to provide a magnetically coupled communication link between the transmitter conductive loop 611 and the receiver conductive loop 613. In addition, leads 651 and 652 that are coupled to a respective of die attach pad 654 and die attach pad 653. Elements within the encapsulation 663 are disposed within the encapsulated portion of the integrated circuit package. Further shown in FIG. 6A is a transmitter 608, a receiver 610, pads 655, 656, 658, and 657, and bond wires 659, 660, 661, and 662.

In one example, transmitter 608 and receiver 610 are implemented as circuits in integrated circuit dice included within the encapsulated portion of the integrated circuit package. Die attach pad 653, which is part of the first conductor of lead frame 600, is denoted by diagonal cross-hatching in FIG. 6A and denotes the portion of the lead frame 600 onto which transmitter 608 is mounted. Similarly, die attach pad 654, which is part of the second conductor of lead frame 600, is shaded with diagonal cross-hatching in FIG. 6A and denotes the portion of the lead frame 600 onto which the receiver 610 is mounted. In one example, the transmitter 608 and receiver 610 are attached to the respective isolated first and second conductors of the lead frame 600 utilizing an adhesive. The adhesive may be non-conductive. In another example, the adhesive may be conductive.

Leads 651 and 652 denote portions of the lead frame 600 which may couple to circuits that are external to the integrated circuit package (in other words, outside of profile 663). Although not shown, various bond wires may couple either the transmitter 608 or the receiver 610 to any of the leads 651 or 652.

The portion of lead frame 600 shaded by loosely packed dots in FIG. 6A corresponds to the transmitter conductive loop 611. The portion of lead frame 600 and bond wires 659 and 660 complete the transmitter conductive loop 611. Bond wire 655 and 660 is attached to the portion of lead frame 600 corresponding to the transmitter conductive loop 611 using wire bonding techniques. Further, the bond wire 659 is coupled to transmitter 608 through pad 655 whereas bond-wire 660 is coupled to the transmitter 608 through pad 656.

The portion of the lead frame 600 shaded by densely packed dots in FIG. 6A corresponds to the receiver conductive loop 613. Bond wires 661 and 662 are attached to the portion of lead frame 600 corresponding to the receiver conduction loop 613 using wire bonding techniques. Bond wire 661 and 662 couples the portion of the lead frame 600 corresponding to the receiver conduction loop 613 to the receiver 610 via pads 658 and 657, respectively. By utilizing galvanically isolated magnetically coupled conductive loops of the lead frame to provide a communications link between the transmitter and, very little cost is added. In addition, utilizing the lead frame may also reduce the overall size of the switch controller and the cost of the package.

FIG. 6B illustrates another configuration for the communication link which utilizes the top metallization layer of an integrated circuit die. FIG. 6B is a perspective view of the example inductive coupling. In the example illustrated, transmitter 608 and receiver 610 are integrated circuit dice included within the encapsulated portion of an integrated circuit package. Part of a transmit loop 611 is formed using the top metal layer of the integrated circuit die of the transmitter 608. Transmit loop 611 is coupled to a pad via a bondwire 659 to complete the loop. In another case, the loop may be completed using only the top metal layer. Similarly, a receiver loop 613 may also be formed using a top metal layer of the integrated circuit die of the receiver 610. The loop may be completed with the top metal layer only or may also be completed via a bondwire 661 coupled to a pad 671. As illustrated, pads 670 and 671 are on the top surface of the transmit die 608 and the receiver die 610. Although the transmit loop 611 and receiver loop 613 are illustrated as substantially circular, the loops could also form a figure eight by introducing a crossover to reduce coupling to an external magnetic field. Further illustrated are lead frames 672 and 673 (shown with dotted lines) which support the transmit die 806 and the receiver die 610, respectively. The lead frames 672 and 673 may could be formed to have a positive effect on the coupling between the transmit loop 611 and the receiver loop 613. For example, gaps or slots could be added to reduce shielding or current carrying paths could be formed.

FIG. 6C illustrates another configuration for the communication link which utilizes the lead frames which support the transmitter die and the receiver die. FIG. 6C is a top down view of the example inductive coupling. In the example illustrated, transmitter 608 and receiver 610 are integrated circuit dice included within the encapsulated portion of an integrated circuit package. Lead frames 672 and 673 (illustrated with dashed lines) support the transmit die 608 and receiver die 610, respectively. The inductive coupling includes a transmit loop 611 and a receiver loop 613 that are defined in the lead frames 672 and 673 of the integrated circuit package. The lead frames 672 and 673 are shaded with dots to illustrate the portions of the lead frames 672 and 673 which may correspond with the transmit loop 611 and receiver loop 613. As illustrated, the lead frames 672 and 673 are shaped such that a notch partially forms the loops. Transmit loop 611 is coupled to the transmit die 608 via bondwires 659, 660, which complete the loop. Similarly, the receiver loop 613 is coupled to the receiver die 610 via bondwires 661, 662, which complete the loop. The configuration illustrated in FIG. 6C may have less area consumption than other configurations.

Figure 7:
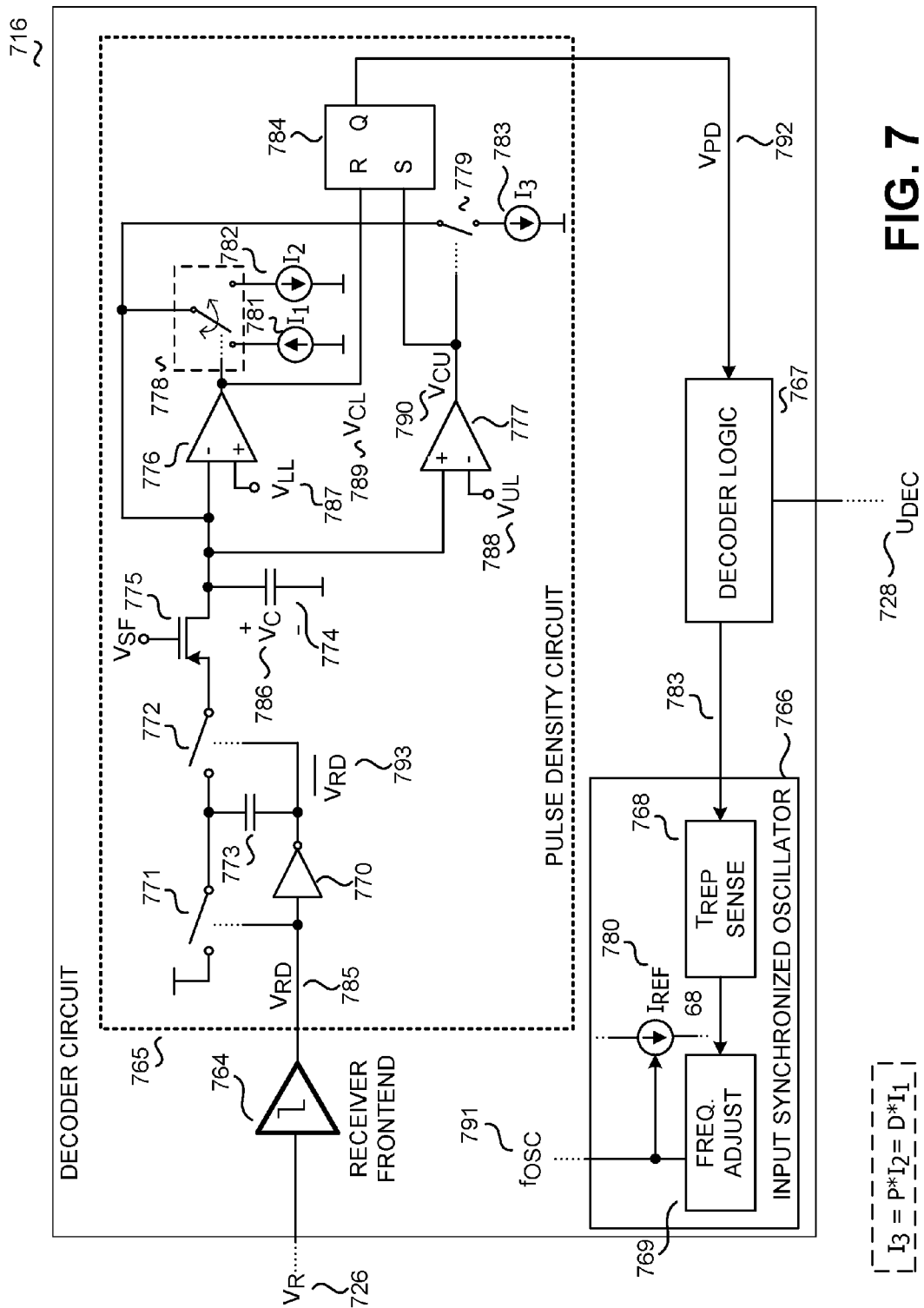
FIG. 7 is a schematic illustrating an example decoder circuit, in accordance with the teachings of the present invention.

FIG. 7 illustrates a decoder circuit 716 that can be used to decode communications that are sent across galvanic isolation from a transmitter to a receiver. For example, decoder circuit 716 can serve as decoder circuit 116 (FIG. 1). In the illustrated implementation, decoder circuit 716 includes an analog receiver frontend 764, a pulse density circuit 765, an input-synchronized oscillator 766, and decoder logic 767. The pulse density circuit 765 may further include switches 771 and 772, inverter 770, p-type metal-oxide semiconductor (PMOS) transistor 775, capacitance 774, comparators 776 and 777, switch 778, switch 779, current source $I_1$ 781, current source $I_2$ 782, current source $I_3$ 783, and latch 784. The input synchronized oscillator 766 may further include repetition period sense circuit 768, frequency adjust circuit 769 and reference current $I_{REF}$ 780. Further illustrated in FIG. 7 are the received signal $V_R$ 726, digital receive signal $V_{RD}$ 785, inverted digital receive signal 793, voltage $V_C$ 786, lower level threshold $V_{LL}$ 787, upper level threshold $V_{UL}$ 788, oscillator signal $f_{OSC}$ 791, pulse density signal $V_{PD}$ 792, and decode signal $U_{DEC}$ 728.

Analog receiver frontend 764 is coupled to receive the receiver voltage $V_R$ 726 and output the digital receive signal $V_{RD}$ 785. The transmit signal $V_T$ may include a number of generally rectangular pulses with relatively sharp, higher frequency components defining, e.g., the corners of the pulses. However, those same higher frequency components may be diminished or even absent from the receiver voltage $V_R$ 726 due to the parallel capacitive coupling of the transmitter and the receiver. The receiver voltage $V_R$ 726 may thus more closely resemble a sinusoidal waveform with added noise. In one example, the analog receiver frontend 764 clamps the receiver voltage $V_R$ 726 to minimum and maximum values and amplifies the receiver voltage $V_R$ 726. In other words, the analog receiver frontend 764 converts the receiver voltage $V_R$ 726 to a digital pulse signal, referred to as the digital receive signal $V_{RD}$ 785.

The pulse density circuit 765 receives the digital receive signal $V_{RD}$ 785 and outputs the pulse density signal $V_{PD}$ 792. The pulse density circuit 765 determines the density of pulses of the digital receive signal $V_{RD}$ 785. The density of pulses in digital receive signal $V_{RD}$ 785 corresponds to the number of pulses (and hence duration of the information portion) in the multi-pulse state representation of transmit signal $V_T$. As such, the decoder circuit 716 may determine if the transmitter is sending ON commands or OFF commands.

The pulse density signal $V_{PD}$ 792 may be a rectangular pulse waveform with varying lengths of logic high and logic low sections. In one example, the length of a logic high section of the pulse density signal $V_{PD}$ 792 is responsive to the determined pulse density of the digital receive signal $V_{RD}$ 785. For example, the length of the logic high section may be longer for longer durations (i.e. greater pulse densities).

Switches 771 and 772, inverter 770, and the capacitance 773 couple together and function as a charge pump. Inverter 770 is coupled to invert the digital receive signal $V_{RD}$ 785 and output the inverted digital receive signal 793. Switches 771 and 772 are controlled by the digital receive signal $V_{RD}$ 785 and the inverted digital receive signal 793. In other words, the digital receive signal $V_{RD}$ 785 is used to drive the charge pump formed by switches 771 and 772, inverter 770, and capacitance 773. In operation, the charge pump converts each pulse of the digital receive signal $V_{RD}$ 785 into a unit of charge which is stored by capacitor 774. The charge pump may inject a well-defined amount of charge into the capacitor 774 due to the stable supply voltage that couples to switch 771 and capacitance 773. Further, a greater number of received pulses may store more charge on capacitor 774. When the digital receive signal $V_{RD}$ 785 pulses to a logic high value, the switch 771 turns on in response and charge is stored on capacitance 773. When the pulse ends, the digital receive signal $V_{RD}$ 785 falls to a logic low value. Switch 772 turns on in response and charge is transferred from capacitance 773 to capacitance 774. The PMOS 775 may be coupled between the switch 772 and the capacitance 774. As illustrated, the PMOS 775 is coupled as a source follower. In some cases, the PMOS 775 may ensure that the delivered charge to the capacitance 774 is constant regardless of the value of the capacitance 774. Further, the PMOS 775 may prevent the capacitance 774 from discharging into capacitance 773.

Capacitance 774 is coupled to comparator 776 at its inverting input and to comparator 777 at its non-inverting input. Comparator 776 is further coupled to the lower level threshold $V_{LL}$ 787 at its non-inverting input while comparator 777 is coupled to the upper level threshold WI, 788 at its inverting input. The output of comparator 776, referred to as the confirmed lower limit $V_{CL}$ 789, may control switch 778. In the illustrated schematic, switch 778 is represented as a single pole double throw (SPDT) switch. In real devices, switch 778 can be implemented as an operational transconductance amplifier that outputs a current determined by current sources L 781 and current source $I_2$ 782, as discussed further below. The output of comparator 777, referred to as confirmed upper limit $V_{CU}$ 790, controls switch 779. In the illustrated schematic, switch 779 is as a single pole single throw (SPST) switch however switch 779 will be implemented differently in real-world devices. Latch 784 receives confirmed lower limit $V_{CL}$ 789 at its R-input and confirmed upper limit $V_{CU}$ 790 at its S-input. The output of the latch 784 is referred to as the pulse density signal $V_{PD}$ 792. Pulse density signal $V_{PD}$ 792 is received by decoder logic 767.

In response to the output of comparator 776 (confirmed lower limit $V_{CL}$ 789) being logic high, switch 778 is positioned so that current source $I_1$ 781 is coupled to charge capacitor 774. In response to confirmed lower limit $V_{CL}$ 789 being logic low, switch 778 is positioned so that the current source $I_2$ 782 is coupled to discharge capacitor 774. Switch 779 is opened in response to the output of comparator 790 (confirmed upper limit $V_{CU}$ 790) being logic low and closed in response to the output of comparator 790 being logic high. When the switch 779 is closed, the current source $I_3$ 783 is coupled to discharge the capacitance 774. In one example, the magnitude of current source $I_3$ 783 is P times greater than the magnitude of current source $I_1$ 781 or D times greater than the magnitude of current source $I_2$ 782. Mathematically, this can be expressed as $I_3=P*I_2=D*I_1$. In a further example, the magnitude of current source $I_1$ 781 is substantially equal to the magnitude of current source $I_2$ 782 (P=D). Specifically, the magnitude of current source $I_3$ 783 may be double the magnitude of both the current source $I_2$ 782 and the magnitude of current source $I_1$ 781. In addition, the current sources $I_1$ 781, $I_2$ 782 and $I_3$ 783 are derived from the reference current $I_{REF}$ 780. In one example, the currents $I_1$ 781, $I_2$ 782 and $I_3$ 783 may be derived using current mirrors with reference current $I_{REF}$ 780 as the reference. Further, the currents $I_1$ 781, $I_2$ 782 may be substantially equal to the reference current $I_{REF}$ 780 and the current $I_3$ 783 may be substantially equal to a multiple of the reference current $I_{REF}$ 780. As will be further discussed, value of the reference current $I_{REF}$ 780 may be increase or decrease in response to the value of the oscillator frequency $f_{OSC}$ 791. Further, the oscillator frequency $f_{OSC}$ 791 may be responsive to the time between multi-level state representations (i.e. repetition period $T_{REP}$) such that the oscillator frequency $f_{OSC}$ 791 and the repetition period $T_{REP}$ are synchronized. Or in other words, the value of the reference current $I_{REF}$ 780 may also be increase or decrease in response to the duration of the repetition period $T_{REP}$.

In operation, when there are no pulses on the digital receive signal $V_{RD}$ 785, comparator 777 regulates the voltage $V_C$ 786 of the capacitance 774 to substantially equal the lower level threshold $V_{LL}$ 787. If the voltage $V_C$ 786 is above the lower level threshold $V_{LL}$ 787, then capacitance 774 is discharged by the current source $I_2$ 782 and the voltage $V_C$ 786 falls. If the voltage $V_C$ 786 is below the lower level threshold $V_{LL}$ 787, then capacitance 774 is charged by current source $I_1$ 781 and voltage $V_C$ 786 increases to the lower level threshold $V_{LL}$ 787. When there are enough pulses in the digital receive signal $V_{RD}$ 785, the pulses are converted to charge by the charge pump and integrated by the capacitance 774. In this case, the voltage $V_C$ 786 increases. If there are enough pulses grouped together, voltage $V_C$ 786 increases to the upper level threshold $V_{UL}$ 788, the confirmed upper level threshold $V_{CU}$ 790 transitions to a logic high value, and confirmed upper level threshold $V_{CU}$ 790 sets latch 784. In response, the output of latch 784 (pulse density signal $V_{PD}$ 792) transitions to a logic high value. Comparator 777 regulates voltage $V_C$ 786 such that voltage $V_C$ 786 does not substantially exceed the upper level signal $V_{UL}$ 788. If voltage $V_C$ 786 is greater than the upper level signal $V_{UL}$ 788, then current source $I_3$ 783 discharges the capacitance 774 and voltage $V_C$ 786 falls. However, if there are enough pulses grouped together, then voltage $V_C$ 786 rises to the upper level signal $V_{UL}$ 788. Switch 779 is closed in response to the upper level signal $V_{UL}$ 788, and capacitance 774 is discharged by the current source $I_3$ 783. In the absence of new incoming pulses, voltage $V_C$ 786 gradually falls to the lower level threshold $V_{LL}$ 787. Once the voltage $V_C$ 786 reaches the lower level threshold $V_{LL}$ 787, the confirmed lower limit $V_{CL}$ 789 transitions to a logic high value and resets the latch 784. In response, the output of the latch 784 (pulse density signal $V_{PD}$ 792) falls to a logic low value. As will be further discussed in FIG. 7, the length of time which the pulse density signal $V_{PD}$ 792 is logic high (shown as time T1 893 and T2 894 with respect to FIG. 8) is responsive to the pulse density of the digital receive signal $V_{RD}$ 785. The longer that pulse density signal $V_{PD}$ 792 is logic high, the longer the pulse density is sufficiently high enough to be interpreted as a valid pulse train.

As shown in FIG. 7, the decoder logic 767 receives the pulse density signal $V_{PD}$ 792 and outputs the decoded signal $U_{DEC}$ 728. In one example, the decoder logic 767 determines which command was received by the decoder circuit 716 from the pulse density signal $V_{PD}$ 792. In some cases, the decoder logic 767 measures the length of time which the pulse density signal $V_{PD}$ 792 is logic high. As discussed above, the bit length of the information portion (i.e. multi-level representation) of an ON command (or ON repetition) may be longer than the bit length of the information portion (i.e. multi-level representation) of an OFF command (or OFF repetition). As such, the length of time which the pulse density signal $V_{PD}$ 792 is greater than a threshold may indicate than an ON command or an ON repetition was received by the decoder. In another example, the decoder logic 767 may determine if the pulse density signal $V_{PD}$ 792 is a valid signal. For example, if the length of time which the pulse density signal $V_{PD}$ 792 is too short, then decoder circuit 716 may determine that there is too much noise on the communication link and that pulse density signal $V_{PD}$ 792 is invalid. Further, the decoder circuit 716 may determine whether the pulse density signal $V_{PD}$ 792 indicates that a CS command has been received.

Decoder logic 767 also outputs a signal 783 to the input synchronized oscillator 766. As illustrated, signal 783 is received by the repetition period sense circuit 768. In operation, the repetition period sense circuit 768 may determine the repetition period $T_{REP}$ (or the time between multi-level representations) based on signal 783. Signal 783 may be the pulse density signal $V_{PD}$ 792 and the repetition period $T_{REP}$ may be the time between falling edges of the pulse density signal $V_{PD}$ 792. In some cases, the repetition period $T_{REP}$ may be sensed by measuring the time between the falling edge and the next rising edge of the pulse density signal $V_{PD}$ 792. The repetition period sense circuit 768 outputs the sensed repetition period $T_{REP}$ to the frequency adjust circuit 769. The frequency adjust circuit 769 adjusts the oscillator frequency $f_{OSC}$ 791 in response to the sensed repetition period $T_{REP}$ such that the oscillator frequency $f_{OSC}$ 791 is synchronized with the repetition period $T_{REP}$. In addition, the reference current $I_{REF}$ 780 is calibrated with the sensed repetition period $T_{REP}$. The reference current $I_{REF}$ 780 may be calibrated by charging a capacitance with a current proportional to reference current $I_{REF}$ 780 to a given value. If the voltage of the capacitance does not reach the value in a given time, which is measured with the oscillator that is synchronized with the primary side, reference current $I_{REF}$ 780 is increased and vice versa.

Figure 8:
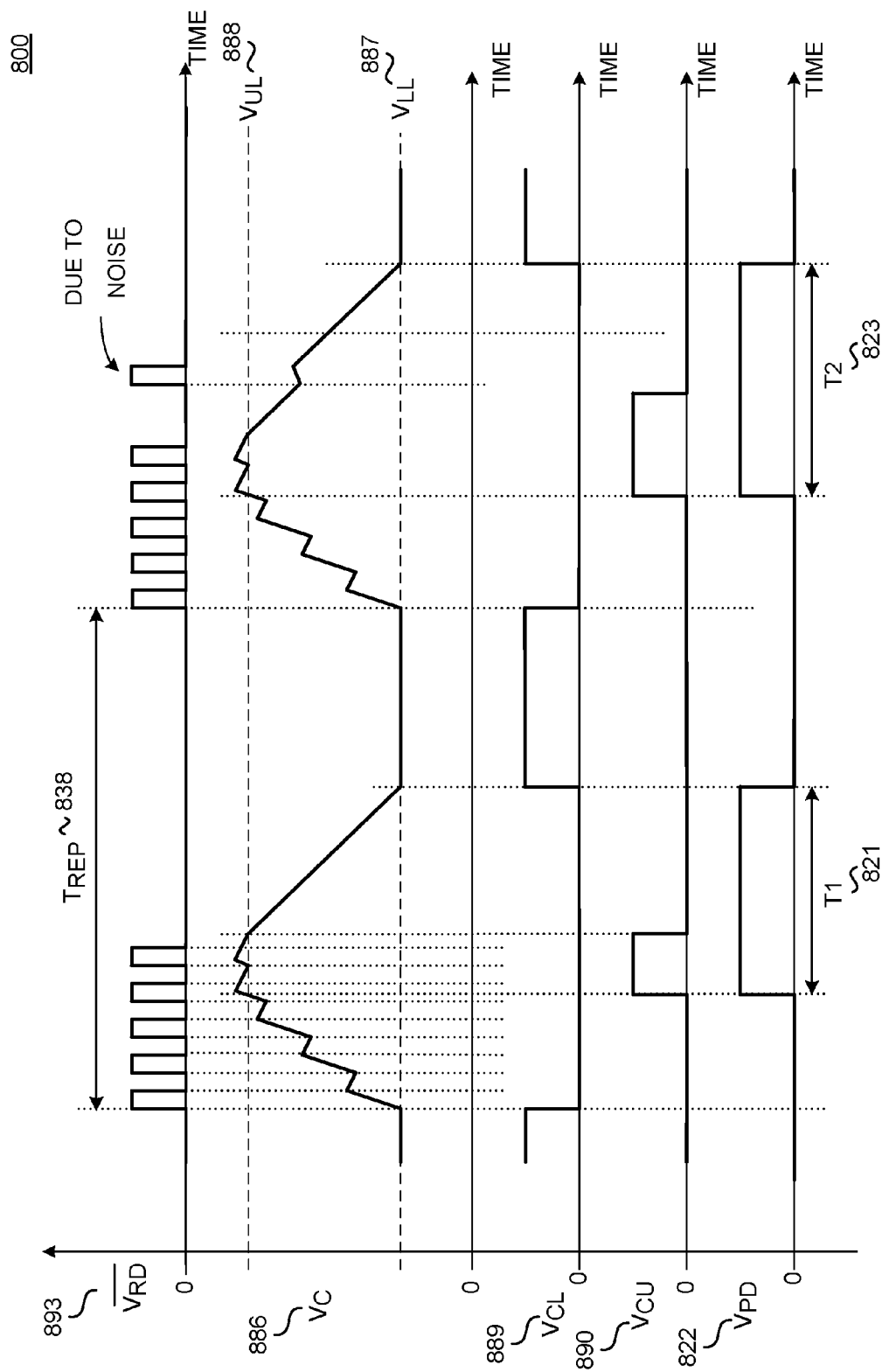
FIG. 8 is a timing diagram illustrating various example waveforms of the decoder circuit of FIG. 7, in accordance with the teachings of the present invention.

FIG. 8 is a timing diagram 800 illustrating various example waveforms of the decoder circuit of FIG. 7. As shown, when there are no pulses in the digital receive signal $V_{RD}$ and the inverted digital receive signal 893, the voltage $V_C$ 886 of the capacitance is substantially equal to the lower level threshold $V_{LL}$ 887 and the confirmed lower limit signal VCL 889 is logic high. After pulses are received (as shown by the inverted digital receive signal 893), voltage $V_C$ 886 increases. If there are enough pulses grouped together, the voltage $V_C$ 886 reaches the upper level threshold $V_{UL}$ 888. In the example shown, the confirmed upper limit signal $V_{CU}$ 890 and the pulse density signal $V_{PD}$ 822 transition to a logic high value. After the pulses stop, the voltage $V_C$ 886 decreases to the lower level threshold $V_{LL}$ 887 and the confirmed lower limit signal $V_{CL}$ 889 transitions to a logic high value. As such, the pulse density signal $V_{PD}$ 822 transitions to the logic low value and the length of time which the pulse density signal $V_{PD}$ 822 is high is denoted as time T1 821.

The time between the start of consecutive multi-level representations is illustrated as the repetition period $T_{REP}$ 838. The next set of pulses may have an additional pulse due to noise. The additional noise pulse has the effect of increasing the voltage $V_C$ 886. However, since the pulse density is low enough, the voltage $V_C$ 886 does not reach the upper level threshold $V_{CL}$ 888. For this set of pulses, the time which the pulse density signal $V_{PD}$ 822 is high is denoted as time T2 823.

Figure 9:
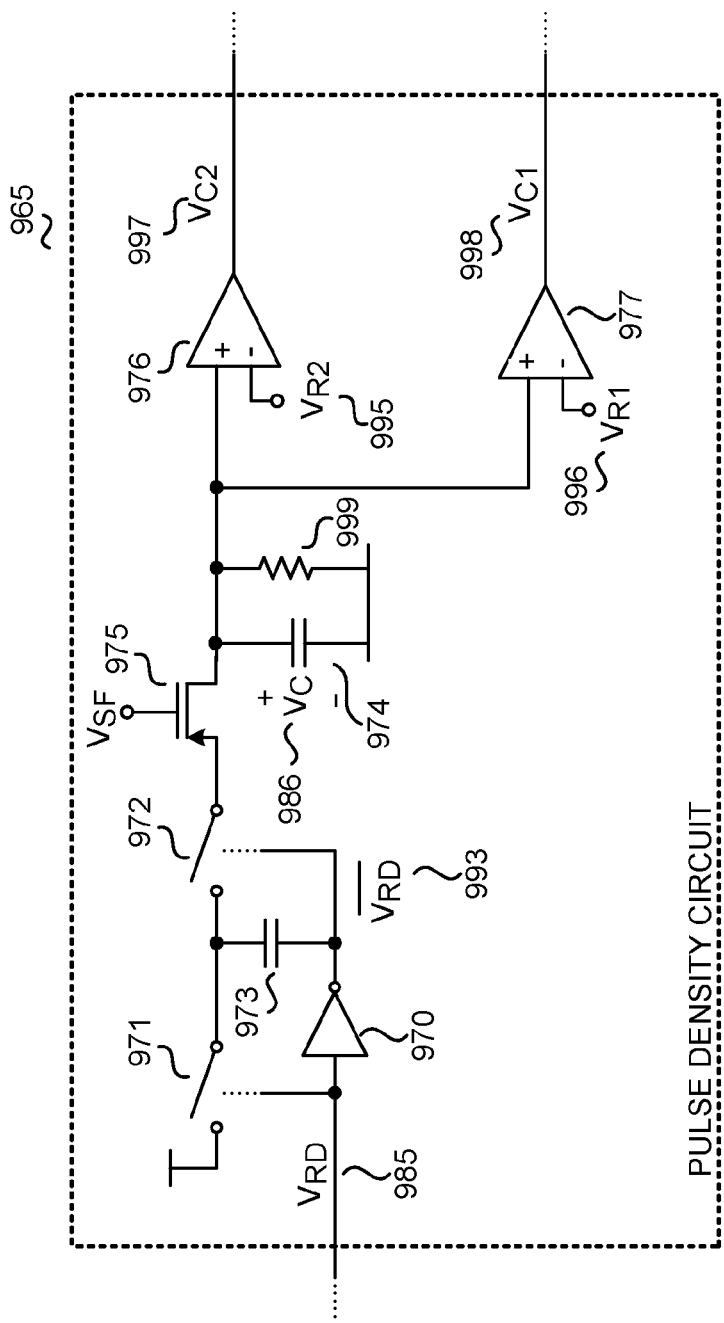
FIG. 9 is a schematic diagram illustrating another example pulse density circuit of the decoder circuit of FIG. 7, in accordance with the teachings of the present invention.

FIG. 9 illustrates another example pulse density circuit 965 which may be utilized in the decoder circuit discussed with respects to FIGS. 1 and 7. Pulse density circuit 965 also includes switches 971 and 972, inverter 970, and capacitance 973 coupled as a charge pump. The charge pump may inject a well-defined amount of charge into the capacitor 974 due to the stable supply voltage which couples to switch 971 and capacitance 973. The charge pump converts each pulse of the digital receive signal $V_{RD}$ 985 into a unit of charge which is stored by capacitor 974. As illustrated, the PMOS 975 is coupled as a source follower. In some cases, the PMOS 975 may ensure that the delivered charge to the capacitance 974 is constant regardless of the value of the capacitance 974. Further, the PMOS 975 prevents the capacitance 974 from discharging into capacitance 973.

Unlike FIG. 7, the pulse density circuit 965 further includes a resistance coupled in parallel with the capacitance 974 to discharge it over time. The resistance 999 and the capacitance 974 may act as a filter. The time-constant of the filter may be calibrated by choosing capacitance 974 to be similar to capacitance 973 and the capacitance used for calibrating the reference current $I_{REF}$ discussed above with respect to FIG. 7. The resistance 999 may be selected such that a given amount of voltage is delivered for a given pulse rate. In some cases, the value of the resistance 999 may be derived from a reference resistor which is adjusted in response to the reference current $I_{REF}$ discussed with respect to FIG. 7 or adjust the reference resistor to deliver the wanted voltage from the reference current $I_{REF}$ to the resistance 999.

Capacitance 986 is coupled to comparators 976 and 977 at their non-inverting inputs. Comparator 976 is coupled to receive second rate threshold $V_{R2}$ 995 at its inverting input. Comparator 977 is coupled to receive first rate threshold $V_{R1}$ 996 at its inverting input. The output of comparator 976 is referred to as the confirmed second rate signal $V_{C2}$ 997. The output of comparator 976 is referred to as the confirmed first rate signal $V_{C1}$ 998. In one example, the confirmed second rate signal $V_{C2}$ 997 represents that the pulse rate density is greater than a second, relatively higher density. The confirmed first rate signal $V_{C1}$ 998 represents that the pulse rate density is greater than a first, relatively lower density. When the voltage $V_C$ 986 of capacitance 974 is greater than the first rate threshold $V_{R1}$ 996, the confirmed first rate signal $V_{C1}$ 998 indicates that the pulse density of the digital receive signal $V_{RD}$ 985 is greater than first, relatively lower density. When the voltage $V_C$ 986 of capacitance 974 is greater than the second rate threshold $V_{R2}$ 995, the confirmed second rate signal $V_{C2}$ 997 indicates that the pulse density of the digital receive signal $V_{RD}$ 985 is greater than the second, relatively higher density. Although FIG. 9 illustrates two comparators, it should be appreciated that any number of comparators may be utilized to for any number of pulse density rates.

Figure 10:
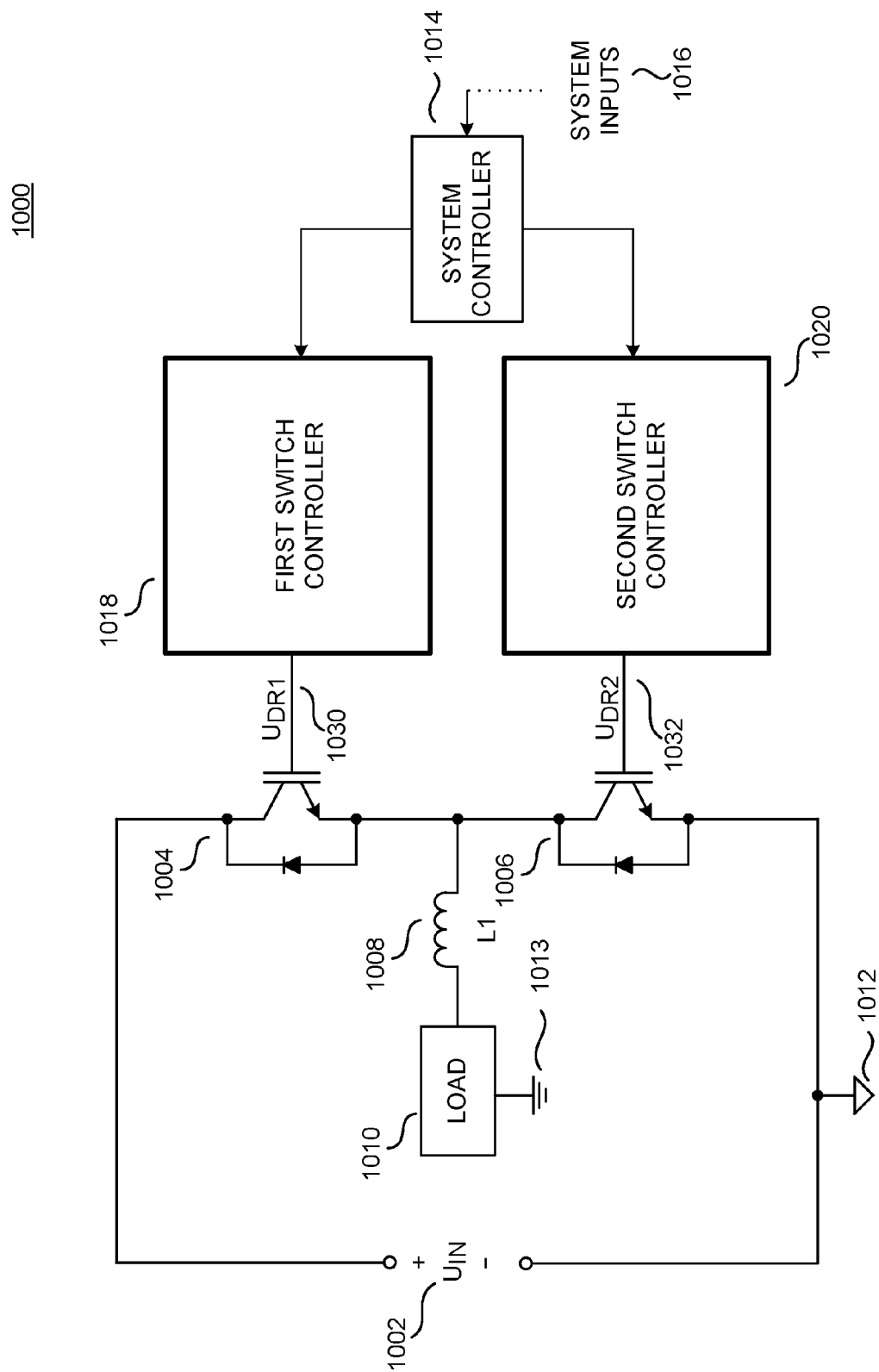
FIG. 10 is an example power conversion system utilizing a switch controller which utilizes a communication link to communicate between a transmitter and a receiver, in accordance with teachings of the present invention.

FIG. 10 illustrates an example power converter 1000 that includes switch controllers in accordance with examples of the present invention. Power converter 1000 provides electrical energy to a load 1010. Power converter 1000 includes two power switches 1004 and 1006 coupled in series. In addition, power converter 1000 receives an input voltage 1002 ($U_{IN}$). Power converter 1000 is designed to transfer electrical energy from the input to a load 1010 by controlling the switching of power switches 1004 and 1006. In different implementations, the power converter 1000 can control voltage, current, or power levels of the energy output to the load.

In the example shown in FIG. 10, the power switches 1004 and 1006 are n-channel IGBTs. However, examples of the present invention can also be used in combination with other power switches. For example, metal-oxide-semiconductor field-effect transistors (MOSFETs), bipolar transistors, injection enhancement gate transistors (IEGTs) and gate turn-off thyristors (GTOs) can be used. In addition, the power converter 1000 can be used with power switches which are based on gallium nitride (GaN) semiconductors or silicon carbide (SiC) semiconductors.

Power switches 1004 and 1006 are each controlled by a first and second control circuit 1018, 1020. The first switch controller 1018 and the second switch controller 1020 may include the switch controller described above. The first switch controller 1018 and the second switch controller 1020 provide a first and second gate driver signal 1030 and 1032 ($U_{DR1}$, $U_{DR2}$) which control the switching of the first and second IGBTs 1004 and 1006. The two control circuits 1018 and 1020 can optionally be controlled by a system controller 1014. Such a system controller can include an input for receiving system input signals 1016. In the example shown in FIG. 10, two power semiconductor switches with a half-bridge configuration are illustrated. However, other topologies can also be used.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the attached claims, it should be understood that the present invention can also (alternatively) be defined in accordance with the following embodiments:

Embodiments

1. A signal transmission system for communicating across galvanic isolation, the signal transmission system comprising:

first circuitry referenced to a first potential, the first circuitry comprising signal transmission circuitry;

second circuitry referenced to a second potential and galvanically isolated from the first circuitry, the second circuitry comprising signal reception circuitry; and a magnetic coupling between the first circuitry to the second circuitry across the galvanic isolation, the magnetic coupling comprising a transmitter-side inductor and a receiver-side inductor;

wherein the signal transmission circuitry comprises a source coupled to output, to the transmitter-side inductor of the magnetic coupling, a first state representation that represents a first logic state with multiple transitions, the first state representation including at least a first upward transition, a first downward transition, a second upward transition, and a second downward transition, and a second state representation that represents a second logic state with multiple transitions.

2. The signal transmission system of any preceding embodiment, wherein:

the transmitter-side inductor has a first terminal at the first potential;

the first upward transition raises a second terminal the transmitter-side inductor above the first potential;

the first downward transition lowers the second terminal of the transmitter-side inductor below the first potential;

the second upward transition raises the second terminal of the transmitter-side inductor above the first potential;

the second downward transition lowers the second terminal of the transmitter-side inductor below the first potential.

3. The signal transmission system of embodiment 2, wherein energy stored in the transmitter-side inductor in a first direction during a time above the first potential defined by the first upward transition and the first downward transition is substantially equal to energy discharged from the transmitter-side inductor in a second direction opposite the first direction during a time below the first potential defined by the first downward transition and the second upward transition.

4. The signal transmission system of embodiment 3, wherein the time above the first potential defined by the first upward transition and the first downward transition is substantially equal to the time below the first potential defined by the first downward transition and the second upward transition.

5. The signal transmission system of any one of embodiments 2 to 4, wherein:

the time above the first potential defined by the first upward transition and the first downward transition is between 1 and 10 nS, for example, between 3 and 7 nS; and the time below the first potential defined by the first downward transition and the second upward transition is between 1 and 10 nS, for example, between 3 and 7 nS.

6. The signal transmission system of any preceding embodiment, wherein the second state representation includes the first upward transition, the first downward transition, the second upward transition, and the second downward transition.

7. The signal transmission system of any preceding embodiment, wherein the second state representation includes a third upward transition, a third downward transition, a fourth upward transition, and a fourth downward transition.

8. The signal transmission system of any preceding embodiment, wherein the transitions in the first state representation and the second state representation are timed to so that the source delivers—to the transmitter-side inductor—a current capable of inducing a measurable potential in the receiver-side inductor during an entirety of the state representation.

9. The signal transmission system of any preceding embodiment, wherein the signal reception circuitry comprises a filter coupled to the receiver-side winding of the small-inductance magnetic coupling, wherein the filter is to pass the transitions in state representations received from the transmitter-side winding but to filter lower frequency components.

10. The signal transmission system of any preceding embodiment, wherein the timing of at least some of the transitions in the first state representation and in the second state representation is selected such that the transmitter-side inductor can demagnetize between the transitions.

11. The signal transmission system of any preceding embodiment, wherein:

the source of the signal transmission circuitry comprises a pulse generator;

the first state representation includes multiple pulses to represent the first logic state;

the second state representation includes multiple pulses to represent the second logic state; and the signal reception circuitry comprises pulse density determination circuitry to determine a density of the pulses within a received signal.

12. The signal transmission system of embodiment 3, wherein the pulse density determination circuitry comprises a charge pump and a capacitor, wherein the charge pump is coupled to charge or discharge the capacitor in accordance with the density of pulses.

13. The signal transmission system of embodiment 7, wherein the signal reception circuitry further comprises a comparator to compare a voltage on the capacitor with a threshold to decode the state representation.

14. The signal transmission system of embodiment 8, wherein the signal reception circuitry further comprises a second comparator to compare the voltage on the capacitor with a second threshold to decode the state representation, wherein the first threshold differs from second threshold.

15. The signal transmission system of any one of embodiments 4 to 6, wherein the pulse density determination circuitry further comprises a current sink coupled to discharge or charge a capacitor with a time constant longer than the duration of the pulses but shorter than the duration of the state representations.

16. The signal transmission system of any preceding embodiment, wherein:

the transmission circuitry comprises a repetition code transmitter to repeatedly transmit a message to the receiver side; and the signal reception circuitry comprises a repetition code receiver.

17. The signal transmission system of embodiment 16, wherein the repetition code transmitter is to repeat a single state representation.

18. The signal transmission system of any one of embodiments 16 to 17, wherein the signal reception circuitry comprises synchronization circuitry to determine a timing of the repetition of the message and adjust an oscillator in the second circuitry based on the determined timing.

19. The signal transmission system of any one of embodiments 16 to 18, wherein the second circuitry further comprises a calibrated current source coupled to discharge a capacitor, wherein the calibrated current source is calibrated based at least in part on the timing of the repetition of the message.

20. The signal transmission system of any preceding embodiment, wherein different state representations have different durations.

21. The signal transmission system of any preceding embodiment, wherein, in outputting the first state representation, the signal transmission circuitry is coupled to output:
an information portion that includes the multiple transitions of the first state representation; and
an initial delay portion having a duration longer than a maximum duration of an information portion of the second state representation, wherein the information portion of the second state representation includes the multiple transitions of the second state representation.

22. The signal transmission system of any preceding embodiment, wherein, in outputting the second state representation, the signal transmission circuitry is coupled to output:
an information portion that includes the multiple transitions of the second state representation; and
an initial delay portion having a duration longer than a maximum duration of an information portion of the first state representation, wherein the information portion of the first state representation includes the multiple transitions of the first state representation.

23. The signal transmission system of any preceding embodiment, wherein:
the transmission circuitry comprises a repetition code transmitter to repeatedly transmit state representations to the receiver side; and
the repetition code transmitter is prohibited from commencing repetition of a preceding state representation during the initial delay portion.

24. The signal transmission system of any one of embodiments 18 to 23, wherein:
the first circuitry further comprises signal reception circuitry coupled to the transmitter-side winding;
the second circuitry further comprises signal transmission circuitry coupled to the receiver-side winding; and
the signal transmission circuitry is further prohibited from outputting information during a backchannel portion for transmission of information from the second circuitry to the first circuitry.

25. The signal transmission system of any one of embodiments 18 to 24, wherein:
the signal transmission circuitry is coupled to transmit a change state command to signal a transition from a first state representation to a second state representation.

26. The signal transmission system of embodiment 16, wherein the change state command is a superposition of at least part of a first state representation and the second state representation.

27. The signal transmission system of any preceding embodiment, wherein:
the first circuitry is formed on a first semiconductor die and the second circuitry is formed on a second semiconductor die; and
the first semiconductor die and the second semiconductor die are packaged in a single semiconductor package.

28. The signal transmission system of any preceding embodiment, wherein the magnetic coupling comprises a winding formed of an upper layer metallization of an integrated circuit.

29. The signal transmission system of any preceding embodiment, wherein the magnetic coupling comprises a portion of a lead frame.

30. The signal transmission system of embodiment 29, wherein a portion of the lead frame is at one of the first potential and the second potential.

31. The signal transmission system of any preceding embodiment, wherein:
the magnetic coupling has an inductance of 50 nH or less, e.g., 20 nH or less; and
the pulse source is configured to generate pulses having a duration of 10 nS or less, e.g., 5 nS or less.

32. A power converter comprising the signal transmission system of any preceding embodiment.

33. The power converter of embodiment 19, wherein the pulse source is coupled to output:
a first state representation indicating that a power switch of the power converter is to transition from an on-state to an off-state; and
a second state representation indicating that a power switch of the power converter is to transition from the off-state to the on-state.

34. The power converter of any one of embodiment 19 to embodiment 20, wherein the power converter comprises an insulated gate bipolar transistor power switch.

35. A controller for a power converter that comprises a power switch, the controller comprising:
primary-side circuitry referenced to a first potential, the first circuitry comprising signal transmission circuitry;
secondary-side circuitry referenced to a second potential and galvanically isolated from the first circuitry, the second circuitry comprising signal reception circuitry and a driver to be coupled to the power switch; and
a magnetic coupling between the primary-side circuitry and the secondary-side circuitry across the galvanic isolation therebetween, the magnetic coupling comprising a transmitter-side inductor and a receiver-side inductor;
wherein the signal transmission circuitry is configured to repeatedly transmit
a first signal indicating that the power switch is to be transitioned from an ON state to an OFF state during a time when the power switch is to be in the OFF state, and
a second signal indicating that a power switch is to be transitioned from the OFF state to the ON state during a time when the power switch is to be in the ON state.

36. The controller of embodiment 35, wherein:
the first signal comprises
a first information portion and
a first delay that does not include information;
the second signal comprises:
a second information portion, and
a second delay that does not include information;
the first delay has a duration greater than or equal to a duration of the second information portion; and
the second delay has a duration greater than or equal to a duration of the first information portion.

37. The controller of any one of embodiments 35 to 36, wherein:
the first information portion includes multiple upward transitions and multiple downward transitions; and
the second information portion includes multiple upward transitions and multiple downward transitions.

38. The controller of any one of embodiments 35 to 37, wherein the signal transmission circuitry comprises a source coupled to output, to the transmitter-side inductor of the magnetic coupling, a first state representation that represents a first logic state with multiple transitions, the first state representation including at least a first upward transition, a first downward transition, a second upward transition, and a second downward transition, and a second state representation that represents a second logic state with multiple transitions.

39. The controller of embodiment 38, wherein the transitions in the first state representation and the second state representation are timed to so that the source delivers—to the transmitter-side inductor—a current capable of inducing a measurable potential in the receiver-side inductor during an entirety of the state representation.

40. The controller of any one of embodiments 38 to 39, wherein the timing of at least some of the transitions in the first information portion and in the second information portion are selected such that the transmitter-side inductor can demagnetize between the transitions.

41. The controller of any one of embodiments 35 to 40, wherein:

the first information portion comprises a collection of M pulses;

the second information portion comprises a collection of N pulses; and

M is not equal to N.

42. The controller of any one of embodiments 35 to 41, wherein the signal transmission circuitry is also configured to transmit a third signal indicating that a power switch is to transition from a) the present of either the ON state and the OFF state to b) the other of the ON state and the OFF state, wherein the third signal is a superposition of at least portions of the first information portion and the second information portion.

43. The controller of any one of embodiments 35 to 41, wherein:

the first signal indicates that the power switch is to be transitioned from the ON state to the OFF state using a first plurality of transitions;

the second signal indicates that the power switch is to be transitioned from the OFF state to the ON state using a second plurality of transitions; and the signal transmission circuitry is also configured to transmit a third signal indicating that a power switch is to transition from a) the present of either the ON state and the OFF state to b) the other of the ON state and the OFF state, wherein the third signal includes transitions appearing in the first plurality of transitions and in the second plurality of transitions.

What is claimed is:

1. A signal transmission system for communicating across galvanic isolation, the signal transmission system comprising:

first circuitry referenced to a first potential, the first circuitry comprising signal transmission circuitry;

second circuitry referenced to a second potential and galvanically isolated from the first circuitry, the second circuitry comprising signal reception circuitry; and a magnetic coupling between the first circuitry to the second circuitry across the galvanic isolation, the magnetic coupling comprising a transmitter-side inductor and a receiver-side inductor;

wherein the signal transmission circuitry comprises a source coupled to output to the transmitter-side inductor of the magnetic coupling, a first state representation that represents a first logic state with multiple transitions, the first state representation including at least a first upward transition, a first downward transition, a second upward transition, and a second downward transition, and a second state representation that represents a second logic state with multiple transitions, wherein, in outputting the first state representation, the signal transmission circuitry is coupled to output:

a first information portion that includes the multiple transitions of the first state representation; and a first initial delay portion having a duration longer than a maximum duration of a second information portion, wherein the second information portion includes the multiple transitions of the second state representation.

2. The signal transmission system of claim 1, wherein the transmitter-side inductor has a first terminal at the first potential, the first upward transition and the second upward transition raise a second terminal of the transmitter-side inductor above the first potential, and the first downward transition and the second downward transition lower the second terminal of the transmitter-side inductor below the first potential.

3. The signal transmission system of claim 1, wherein energy stored in the transmitter-side inductor in a first direction during a time above the first potential defined by the first upward transition and the first downward transition is substantially equal to energy discharged from the transmitter-side inductor in a second direction opposite the first direction during a time below the first potential defined by the first downward transition and the second upward transition.

4. The signal transmission system of claim 3, wherein the time above the first potential defined by the first upward transition and the first downward transition is substantially equal to the time below the first potential defined by the first downward transition and the second upward transition.

5. The signal transmission system of claim 1, wherein the time above the first potential defined by the first upward transition and the first downward transition is between 1 and 10 nS, for example, between 3 and 7 nS, and the time below the first potential defined by the first downward transition and the second upward transition is between 1 and 10 nS, for example, between 3 and 7 nS.

6. The signal transmission system of claim 1, wherein the second state representation includes the first upward transition, the first downward transition, the second upward transition, and the second downward transition.

7. The signal transmission system of claim 1, wherein the second state representation includes a third upward transition, a third downward transition, a fourth upward transition, and a fourth downward transition.

8. The signal transmission system of claim 1, wherein the transitions in the first state representation and the second state representation are timed to so that the source delivers—to the transmitter-side inductor—a current capable of inducing a measurable potential in the receiver-side inductor during an entirety of the state representation.

9. The signal transmission system of claim 1, wherein the signal reception circuitry comprises a filter coupled to the receiver-side winding of the small-inductance magnetic coupling, wherein the filter is to pass the transitions in state representations received from the transmitter-side winding but to filter lower frequency components.

10. The signal transmission system of claim 1, wherein the timing of at least some of the transitions in the first state representation and in the second state representation is selected such that the transmitter-side inductor can demagnetize between the transitions.

11. The signal transmission system of claim 1, wherein:
the source of the signal transmission circuitry comprises a pulse generator,
the first state representation includes multiple pulses to represent the first logic state,
the second state representation includes multiple pulses to represent the second logic state, and
the signal reception circuitry comprises pulse density determination circuitry to determine a density of the pulses within a received signal.

12. The signal transmission system of claim 11, wherein the pulse density determination circuitry comprises a charge pump and a capacitor, wherein the charge pump is coupled to charge or discharge the capacitor in accordance with the density of pulses.

13. The signal transmission system of claim 12, wherein the signal reception circuitry further comprises a comparator to compare a voltage on the capacitor with a threshold to decode the state representation.

14. The signal transmission system of claim 13, wherein the signal reception circuitry further comprises a second comparator to compare the voltage on the capacitor with a second threshold to decode the state representation, wherein the first threshold differs from second threshold.

15. The signal transmission system of claim 11, wherein the pulse density determination circuitry further comprises a current sink coupled to discharge or charge a capacitor with a time constant longer than the duration of the pulses but shorter than the duration of the state representations.

16. The signal transmission system of claim 1, wherein:
the transmission circuitry comprises a repetition code transmitter to repeatedly transmit a message to the receiver side, and
the signal reception circuitry comprises a repetition code receiver.

17. The signal transmission system of claim 16, wherein the repetition code transmitter is to repeat a single state representation.

18. The signal transmission system of claim 16, wherein the signal reception circuitry comprises synchronization circuitry to determine a timing of the repetition of the message and adjust an oscillator in the second circuitry based on the determined timing.

19. The signal transmission system of claim 16, wherein the second circuitry further comprises a calibrated current source coupled to discharge a capacitor, wherein the calibrated current source is calibrated based at least in part on the timing of the repetition of the message.

20. The signal transmission system of claim 1, wherein different state representations have different durations.

21. The signal transmission system of claim 1, wherein, in outputting the second state representation, the signal transmission circuitry is coupled to output:
the second information portion that includes the multiple transitions of the second state representation; and
the second initial delay portion having a duration longer than a maximum duration of the first information portion of the first state representation, wherein the first information portion of the first state representation includes the multiple transitions of the first state representation.

22. The signal transmission system of claim 1, wherein the transmission circuitry comprises a repetition code transmitter to repeatedly transmit state representations to the receiver side, and
the repetition code transmitter is prohibited from commencing repetition of a preceding state representation during the first initial delay portion.

23. The signal transmission system of claim 18, wherein:
the first circuitry further comprises signal reception circuitry coupled to the transmitter-side winding,
the second circuitry further comprises signal transmission circuitry coupled to the receiver-side winding, and
the signal transmission circuitry is further prohibited from outputting information during a backchannel portion for transmission of information from the second circuitry to the first circuitry.

24. The signal transmission system of claim 18, wherein:
the signal transmission circuitry is coupled to transmit a change state command to signal a transition from a first state representation to a second state representation.

25. The signal transmission system of claim 24, wherein the change state command is a superposition of at least part of a first state representation and the second state representation.

26. The signal transmission system of claim 1, wherein:
the first circuitry is formed on a first semiconductor die and the second circuitry is formed on a second semiconductor die, and
the first semiconductor die and the second semiconductor die are packaged in a single semiconductor package.

27. The signal transmission system of claim 1, wherein the magnetic coupling comprises a winding formed of an upper layer metallization of an integrated circuit.

28. The signal transmission system of claim 1, wherein the magnetic coupling comprises a portion of a lead frame.

29. The signal transmission system of claim 28, wherein a portion of the lead frame is at one of the first potential and the second potential.

30. The signal transmission system of claim 1, wherein:
the magnetic coupling has an inductance of 50 nH or less, e.g., 20 nH or less; and a pulse source is configured to generate pulses having a duration of 10 nS or less, e.g., 5 nS or less.

31. The signal transmission system of claim 30, wherein the pulse source is coupled to output:
a first state representation indicating that a power switch of a power converter is to transition from an on-state to an off-state, and
a second state representation indicating that a power switch of a power converter is to transition from the off-state to the on-state.

32. A controller for a power converter that comprises a power switch, the controller comprising:
primary-side circuitry referenced to a first potential, the first circuitry comprising signal transmission circuitry;
secondary-side circuitry referenced to a second potential and galvanically isolated from the first circuitry, the second circuitry comprising signal reception circuitry and a driver to be coupled to the power switch; and
a magnetic coupling between the primary-side circuitry and the secondary-side circuitry, the magnetic coupling comprising a transmitter-side inductor and a receiver-side inductor, wherein the signal transmission circuitry is configured to repeatedly transmit
a first signal indicating that the power switch is to be transitioned from an ON state to an OFF state during a time when the power switch is to be in the OFF state, wherein the first signal comprises:
a first information portion, and
a first delay that does not include information, and
a second signal indicating that a power switch is to be transitioned from the OFF state to the ON state during a time when the power switch is to be in the ON state, wherein the second signal comprises:
a second information portion, and
a second delay that does not include information,
wherein the first delay has a duration greater than or equal to a duration of the second information portion, and
wherein the second delay has a duration greater than or equal to a duration of the first information portion.

33. The controller of claim 32, wherein:
the first information portion includes multiple upward transitions and multiple downward transitions, and
the second information portion includes multiple upward transitions and multiple downward transitions.

34. The controller of claim 32, wherein the signal transmission circuitry comprises a source coupled to output, to the transmitter-side inductor of the magnetic coupling,
a first state representation that represents a first logic state with multiple transitions, the first state representation including at least a first upward transition, a first downward transition, a second upward transition, and a second downward transition, and
a second state representation that represents a second logic state with multiple transitions.

35. The controller of claim 34, wherein the transitions in the first state representation and the second state representation are timed so that the source delivers—to the transmitter-side inductor—a current capable of inducing a measurable potential in the receiver-side inductor during an entirety of the state representation.

36. The controller of claim 33, wherein the timing of at least some of the transitions in the first information portion and in the second information portion are selected such that the transmitter-side inductor can demagnetize between the transitions.

37. The controller of claim 32, wherein:
the first information portion comprises a collection of M pulses,
the second information portion comprises a collection of N pulses, and
M is not equal to N.

38. The controller of claim 32, wherein the signal transmission circuitry is also configured to transmit a third signal indicating that a power switch is to transition from
a) the present of either the ON state and the OFF state to
b) the other of the ON state and the OFF state,
wherein the third signal is a superposition of at least portions of the first information portion and the second information portion.

39. The controller of claim 38, wherein:
the first signal indicates that the power switch is to be transitioned from the ON state to the OFF state using a first plurality of transitions,
the second signal indicates that the power switch is to be transitioned from the OFF state to the ON state using a second plurality of transitions, and
the signal transmission circuitry is also configured to transmit a third signal indicating that a power switch is to transition from
a) the present of either the ON state and the OFF state to
b) the other of the ON state and the OFF state,
wherein the third signal includes transitions appearing in the first plurality of transitions and in the second plurality of transitions.

* * * * *